(12) United States Patent
Zheng

(10) Patent No.: US 9,012,876 B2
(45) Date of Patent: *Apr. 21, 2015

(54) GERMANIUM ANTIMONY TELLURIDE MATERIALS AND DEVICES INCORPORATING SAME

(75) Inventor: Jun-Fei Zheng, Westport, CT (US)

(73) Assignee: Entegris, Inc., Billerica, MA (US)

( * ) Notice: Subject to any disclaimer, the term of this patent is extended or adjusted under 35 U.S.C. 154(b) by 224 days.

This patent is subject to a terminal disclaimer.

(21) Appl. No.: 13/637,018

(22) PCT Filed: May 21, 2010

(86) PCT No.: PCT/US2010/035854
§ 371 (c)(1),
(2), (4) Date: Dec. 3, 2012

(87) PCT Pub. No.: WO2011/119175
PCT Pub. Date: Sep. 29, 2011

(65) Prior Publication Data
US 2013/0078475 A1 Mar. 28, 2013

Related U.S. Application Data

(60) Provisional application No. 61/317,829, filed on Mar. 26, 2010.

(51) Int. Cl.
*H01L 45/00* (2006.01)
*H01B 1/02* (2006.01)
(Continued)

(52) U.S. Cl.
CPC ............... *H01B 1/02* (2013.01); *C01B 19/002* (2013.01); *C01B 19/007* (2013.01);
(Continued)

(58) Field of Classification Search
CPC C01B 19/002; C01B 19/007; C01B 21/0828; C22C 16/00; C22C 16/34; C22C 16/305; H01L 45/00; H01L 45/06; H01L 45/1233; H01L 45/144; H01L 45/1616

USPC ............ 257/2, 4, E21.52, E29.002; 428/697, 428/698, 699; 106/286, 2
See application file for complete search history.

(56) References Cited

U.S. PATENT DOCUMENTS 3,467,686 A  9/1969  Creamer
4,383,119 A  5/1983  Pullukat et al.
(Continued)

FOREIGN PATENT DOCUMENTS

EP  1466918 A1  10/2004
EP  1675194 A2  6/2006
(Continued)

OTHER PUBLICATIONS

Abrutis, A., et al., "Hot-Wire Chemical Vapor Deposition of Chalcogenide Materials for Phase Change Memory Applications", "Chem. Mater.", May 2008, pp. 3557-3559, vol. 20, No. 11.
(Continued)

*Primary Examiner* — Archene Turner
(74) *Attorney, Agent, or Firm* — Hultquist, PLLC; Steven J. Hultquist; Maggie Chappuis

(57) ABSTRACT

Germanium antimony telluride materials are described, e.g., material of the formula $Ge_xSb_yTe_zC_mN_n$, wherein x is about 0.1-0.6, y is about 0-0.7, z is about 0.2-0.9, m is about 0.02-0.20, and n is about 0.2-0.20. One specific composition includes from 0 to 50% Sb, from 50 to 80% Te, from 20 to 50% Ge, from 3 to 20% N and from 2 to 15% carbon, wherein all atomic percentages of all components of the film total to 100 atomic %. Another specific composition includes from 10 to 50% Sb, from 50 to 80% Te, from 10 to 50% Ge, from 3 to 20% N and from 3 to 20% carbon, and wherein all atomic percentages of all components of the film total to 100 atomic %. Material of such composition is useful to form phase change films, e.g., as conformally coated on a phase change memory device substrate to fabricate a phase change random access memory cell.

21 Claims, 19 Drawing Sheets

(51) Int. Cl.

| | | |
|---|---|---|
| C01B 19/00 | (2006.01) | |
| C01B 21/082 | (2006.01) | |
| C22C 16/00 | (2006.01) | |
| C22C 30/00 | (2006.01) | |
| C23C 16/30 | (2006.01) | |
| C23C 16/34 | (2006.01) | |
| G11C 13/00 | (2006.01) | |

(52) U.S. Cl.
CPC .............. *C01B 21/0828* (2013.01); *C22C 16/00* (2013.01); *C22C 30/00* (2013.01); *C23C 16/305* (2013.01); *C23C 16/34* (2013.01); *H01L 45/06* (2013.01); *H01L 45/1233* (2013.01); *H01L 45/144* (2013.01); *H01L 45/1616* (2013.01); *H01L 45/00* (2013.01); *C01P 2002/50* (2013.01); *G11C 13/0004* (2013.01)

(56) References Cited

U.S. PATENT DOCUMENTS

| | | |
|---|---|---|
| 4,491,669 A | 1/1985 | Arkles et al. |
| 4,499,198 A | 2/1985 | Pullukat et al. |
| 4,895,709 A | 1/1990 | Laine |
| 4,927,670 A | 5/1990 | Erbil |
| 4,948,623 A | 8/1990 | Beach et al. |
| 4,960,916 A | 10/1990 | Pazik |
| 4,962,214 A | 10/1990 | Villacorta et al. |
| 5,003,092 A | 3/1991 | Beachley, Jr. |
| 5,008,422 A | 4/1991 | Blum et al. |
| 5,084,588 A | 1/1992 | Ocheltree et al. |
| 5,139,825 A | 8/1992 | Gordon et al. |
| 5,178,911 A | 1/1993 | Gordon et al. |
| 5,210,254 A | 5/1993 | Ritscher et al. |
| 5,225,561 A | 7/1993 | Kirlin et al. |
| 5,268,496 A | 12/1993 | Geisberger |
| 5,312,983 A | 5/1994 | Brown et al. |
| 5,417,823 A | 5/1995 | Narula et al. |
| 5,442,200 A | 8/1995 | Tischler |
| 5,453,494 A | 9/1995 | Kirlin et al. |
| 5,566,045 A | 10/1996 | Summerfelt et al. |
| 5,576,928 A | 11/1996 | Summerfelt et al. |
| 5,583,205 A | 12/1996 | Rees, Jr. |
| 5,596,522 A | 1/1997 | Ovshinsky et al. |
| 5,653,806 A | 8/1997 | Van Buskirk |
| 5,687,112 A * | 11/1997 | Ovshinsky .................... 257/4 |
| 5,698,726 A | 12/1997 | Rauleder et al. |
| 5,719,417 A | 2/1998 | Roeder et al. |
| 5,726,294 A | 3/1998 | Rees, Jr. |
| 5,820,664 A | 10/1998 | Gardiner et al. |
| 5,919,522 A | 7/1999 | Baum et al. |
| 5,976,991 A | 11/1999 | Laxman et al. |
| 5,980,265 A | 11/1999 | Tischler |
| 5,998,236 A | 12/1999 | Roeder et al. |
| 6,005,127 A | 12/1999 | Todd et al. |
| 6,015,917 A | 1/2000 | Bhandari et al. |
| 6,086,779 A | 7/2000 | Bishop et al. |
| 6,133,051 A | 10/2000 | Hintermaier et al. |
| 6,146,608 A | 11/2000 | Todd et al. |
| 6,269,979 B1 | 8/2001 | Dumont |
| 6,281,022 B1 | 8/2001 | Li et al. |
| 6,319,565 B1 | 11/2001 | Todd et al. |
| 6,399,208 B1 | 6/2002 | Baum et al. |
| 6,506,666 B2 | 1/2003 | Marsh |
| 6,511,718 B1 | 1/2003 | Paz de Araujo et al. |
| 6,646,122 B1 | 11/2003 | Nuhlen et al. |
| 6,716,271 B1 | 4/2004 | Arno et al. |
| 6,750,079 B2 | 6/2004 | Lowrey et al. |
| 6,767,830 B2 | 7/2004 | Wang et al. |
| 6,787,186 B1 | 9/2004 | Hintermaier |
| 6,861,559 B2 | 3/2005 | Odom |
| 6,869,638 B2 | 3/2005 | Baum et al. |
| 6,872,963 B2 | 3/2005 | Kostylev et al. |
| 6,916,944 B2 | 7/2005 | Furukawa et al. |
| 6,984,591 B1 | 1/2006 | Buchanan et al. |
| 6,998,289 B2 | 2/2006 | Hudgens et al. |
| 7,005,303 B2 | 2/2006 | Hintermaier et al. |
| 7,029,978 B2 | 4/2006 | Dodge |
| 7,087,482 B2 | 8/2006 | Yeo et al. |
| 7,114,517 B2 | 10/2006 | Sund et al. |
| 7,115,927 B2 | 10/2006 | Hideki et al. |
| 7,312,165 B2 | 12/2007 | Jursich et al. |
| 7,371,429 B2 | 5/2008 | Lee et al. |
| 7,397,060 B2 | 7/2008 | Lung |
| 7,399,666 B2 | 7/2008 | Ahn et al. |
| 7,402,851 B2 | 7/2008 | Hideki et al. |
| 7,419,698 B2 | 9/2008 | Jones |
| 7,425,735 B2 | 9/2008 | Park et al. |
| 7,462,900 B2 | 12/2008 | Hideki et al. |
| 7,476,917 B2 | 1/2009 | Hideki et al. |
| 7,488,967 B2 | 2/2009 | Burr et al. |
| 7,525,117 B2 * | 4/2009 | Kostylev et al. .................... 257/4 |
| 7,569,417 B2 | 8/2009 | Lee et al. |
| 7,615,401 B2 | 11/2009 | Park et al. |
| 7,632,456 B2 * | 12/2009 | Cheong et al. .................... 257/613 |
| 7,704,787 B2 | 4/2010 | Hideki et al. |
| 7,728,172 B2 | 6/2010 | Lee et al. |
| 7,791,932 B2 * | 9/2010 | Kuh et al. .................... 257/4 |
| 7,838,329 B2 | 11/2010 | Hunks et al. |
| 7,943,502 B2 | 5/2011 | Park et al. |
| 7,943,923 B2 | 5/2011 | Gidon |
| 8,008,117 B2 | 8/2011 | Hunks et al. |
| 8,192,592 B2 * | 6/2012 | Kim et al. .................... 204/192.26 |
| 8,272,347 B2 | 9/2012 | Nasman et al. |
| 8,330,136 B2 | 12/2012 | Zheng et al. |
| 8,410,468 B2 * | 4/2013 | Zheng .................... 257/2 |
| 8,445,354 B2 * | 5/2013 | Ha et al. .................... 257/E21.52 |
| 2002/0004266 A1 | 1/2002 | Hashimoto et al. |
| 2002/0090815 A1 | 7/2002 | Koike et al. |
| 2003/0135061 A1 | 7/2003 | Norman et al. |
| 2004/0012009 A1 | 1/2004 | Casagrande et al. |
| 2004/0038808 A1 | 2/2004 | Hampden-Smith et al. |
| 2004/0197945 A1 | 10/2004 | Woelk et al. |
| 2004/0215030 A1 | 10/2004 | Norman |
| 2005/0029502 A1 | 2/2005 | Hudgens |
| 2005/0082624 A1 | 4/2005 | Gousev et al. |
| 2005/0208699 A1 | 9/2005 | Furkay et al. |
| 2005/0267345 A1 | 12/2005 | Korgel et al. |
| 2005/0283012 A1 | 12/2005 | Xu et al. |
| 2005/0287747 A1 | 12/2005 | Chakravarti et al. |
| 2006/0006449 A1 | 1/2006 | Jeong et al. |
| 2006/0027451 A1 | 2/2006 | Park et al. |
| 2006/0035462 A1 | 2/2006 | Millward |
| 2006/0046521 A1 | 3/2006 | Vaartstra et al. |
| 2006/0049447 A1 | 3/2006 | Lee et al. |
| 2006/0115595 A1 | 6/2006 | Shenai-Khatkhate et al. |
| 2006/0138393 A1 | 6/2006 | Seo et al. |
| 2006/0141155 A1 | 6/2006 | Gordon et al. |
| 2006/0141710 A1 | 6/2006 | Yoon et al. |
| 2006/0172067 A1 | 8/2006 | Ovshinsky et al. |
| 2006/0172083 A1 | 8/2006 | Lee et al. |
| 2006/0180811 A1 | 8/2006 | Lee et al. |
| 2007/0090336 A1 | 4/2007 | Asano et al. |
| 2007/0121363 A1 | 5/2007 | Lung |
| 2007/0154637 A1 | 7/2007 | Shenai-Khatkhate et al. |
| 2007/0160760 A1 | 7/2007 | Shin et al. |
| 2007/0246748 A1 | 10/2007 | Breitwisch et al. |
| 2008/0003359 A1 | 1/2008 | Gordon et al. |
| 2008/0035906 A1 | 2/2008 | Park et al. |
| 2008/0035961 A1 | 2/2008 | Chen et al. |
| 2008/0078984 A1 | 4/2008 | Park et al. |
| 2008/0099791 A1 * | 5/2008 | Lung .................... 257/213 |
| 2008/0118636 A1 | 5/2008 | Shin et al. |
| 2008/0169457 A1 | 7/2008 | Hideki et al. |
| 2008/0210163 A1 | 9/2008 | Carlson et al. |
| 2008/0254218 A1 | 10/2008 | Lei et al. |
| 2008/0254232 A1 | 10/2008 | Gordon et al. |
| 2008/0258127 A1 | 10/2008 | Lee et al. |
| 2008/0290335 A1 | 11/2008 | Lin et al. |
| 2009/0020738 A1 | 1/2009 | Happ et al. |
| 2009/0075420 A1 | 3/2009 | Bae et al. |
| 2009/0087561 A1 | 4/2009 | Chen et al. |
| 2009/0097305 A1 | 4/2009 | Bae et al. |

(56) References Cited

U.S. PATENT DOCUMENTS

| | | |
|---|---|---|
| 2009/0101883 A1 | 4/2009 | Lai et al. |
| 2009/0112009 A1 | 4/2009 | Chen et al. |
| 2009/0124039 A1 | 5/2009 | Roeder et al. |
| 2009/0215225 A1 | 8/2009 | Stender et al. |
| 2009/0227066 A1 | 9/2009 | Joseph et al. |
| 2009/0275164 A1 | 11/2009 | Chen et al. |
| 2009/0291208 A1 | 11/2009 | Gordon et al. |
| 2009/0298223 A1 | 12/2009 | Cheek et al. |
| 2009/0305458 A1 | 12/2009 | Hunks et al. |
| 2009/0321733 A1 | 12/2009 | Gatineau et al. |
| 2010/0012917 A1 | 1/2010 | Takaura et al. |
| 2010/0018439 A1 | 1/2010 | Cameron et al. |
| 2010/0054029 A1 | 3/2010 | Happ et al. |
| 2010/0112211 A1 | 5/2010 | Xu et al. |
| 2010/0112795 A1 | 5/2010 | Kaim et al. |
| 2010/0164057 A1 | 7/2010 | Hunks et al. |
| 2010/0190341 A1 | 7/2010 | Park et al. |
| 2010/0209610 A1 | 8/2010 | Cameron et al. |
| 2010/0270527 A1 | 10/2010 | Sawamura |
| 2010/0317150 A1 | 12/2010 | Hunks et al. |
| 2011/0001107 A1 | 1/2011 | Zheng |
| 2011/0060165 A1 | 3/2011 | Cameron et al. |
| 2011/0065252 A1 | 3/2011 | Nakamura |
| 2011/0111556 A1 | 5/2011 | Chen et al. |
| 2011/0124182 A1 | 5/2011 | Zheng |
| 2011/0227021 A1 | 9/2011 | Schrott et al. |
| 2011/0260132 A1 | 10/2011 | Zheng et al. |
| 2011/0263100 A1 | 10/2011 | Hunks et al. |
| 2012/0115315 A1 | 5/2012 | Zheng et al. |
| 2013/0112933 A1* | 5/2013 | Zheng .................. 106/286.2 |

FOREIGN PATENT DOCUMENTS

| | | |
|---|---|---|
| EP | 1806427 A2 | 7/2007 |
| JP | 58-38296 A | 3/1983 |
| JP | 5-311423 A | 11/1993 |
| JP | 6-80413 A | 3/1994 |
| JP | 6-293778 A | 10/1994 |
| JP | 7-263431 A | 10/1995 |
| JP | 8-74055 A | 3/1996 |
| JP | 2001-67720 A | 3/2001 |
| JP | 2002-211924 A | 7/2002 |
| JP | 2002-220658 A | 8/2002 |
| JP | 2006-124262 A | 5/2006 |
| JP | 2006-182781 A | 7/2006 |
| JP | 2008-252088 A | 10/2008 |
| JP | 2011-66135 A | 3/2011 |
| KR | 10-2004-0076225 A | 8/2004 |
| KR | 10-2005-0048891 A | 5/2005 |
| KR | 10-0585175 B1 | 5/2006 |
| KR | 10-2006-0091160 A | 8/2006 |
| KR | 10-2007-0025612 A | 3/2007 |
| KR | 10-0695168 B1 | 3/2007 |
| KR | 10-2007-0105752 A | 10/2007 |
| KR | 10-2008-0052362 A | 6/2008 |
| KR | 10-2008-0080273 A | 9/2008 |
| KR | 10-2009-0008799 A | 1/2009 |
| KR | 10-2009-0029488 A | 3/2009 |
| KR | 10-2009-0036771 A | 4/2009 |
| KR | 10-2009-0045132 A | 5/2009 |
| KR | 10-1067969 B1 | 9/2011 |
| SU | 768457 A | 10/1980 |
| WO | 0015865 A1 | 3/2000 |
| WO | 0067300 A1 | 11/2000 |
| WO | 2004046417 A2 | 6/2004 |
| WO | 2004076712 A1 | 9/2004 |
| WO | 2005084231 A2 | 9/2005 |
| WO | 2006012052 A2 | 2/2006 |
| WO | 2007070218 A2 | 6/2007 |
| WO | 2007126690 A2 | 11/2007 |
| WO | 2007140813 A1 | 12/2007 |
| WO | 2008002546 A1 | 1/2008 |
| WO | 2008057616 A2 | 5/2008 |
| WO | 2009006272 A1 | 1/2009 |
| WO | 2009020888 A1 | 2/2009 |
| WO | 2009034775 A1 | 3/2009 |
| WO | 2009059237 A2 | 5/2009 |
| WO | 2011002705 A2 | 1/2011 |
| WO | 2011146913 A2 | 11/2011 |

OTHER PUBLICATIONS

Allen, F., et al., "Tables of Bond Lengths Determined by X-ray and Neutron Diffraction. Part 1. Bond Lengths in Organic Compounds", "J. Chem. Soc. Perkin Tran. II", 1987, pp. S1-S19.

Anderson, H., "Dialkylaminogermanes and Dialkylaminosilanes", "J. Amer. Chem. Soc.", Mar. 20, 1952, pp. 1421-1423, vol. 74, No. 6.

Anderson, Q., et al., "Synthesis and Characterization of the First Pentaphenylcyclopentadienyl Copper(I) Complex, (Ph5Cp)Cu(PPh3)", "Organometallics", 1998, pp. 4917-4920, vol. 17.

Artaud-Gillet, M., et al., "Evaluation of copper organometallic sources for CuGaSe2 photovoltaic applications", "Journal of Crystal Growth", 2003, pp. 163-168, vol. 248.

Auner, N., et al., "Organosilicon Chemistry IV: From Molecules to Materials", Mar. 2000, p. 291 (Abstract), Publisher: Wiley-Vch.

Baines, K., et al., "A Facile Digermene-to-germylgermylene Rearrangement; Bulky Germylene Insertion into the Si-H Bond", "J. Chem. Soc. Chem. Commun.", 1992, pp. 1484-1485.

Baxter, D., et al., "Low Pressure Chemical Vapor Deposition of Metallic Films of Iron, Manganese, Cobalt, Copper, Germanium and Tin Employing Bis(trimethyl)silylamido Complexes, M(N(SiMe3)2)n", "Chemical Vapor Deposition", 1995, pp. 49-51, vol. 1, No. 2.

Behrens, S., et al., "Synthesis and Structure of the Nanoclusters [Hg32Se14(SePh)36], [Cd32Se14(SePh) 36"(PPh3)4], [P(Et)2(Ph)C4H8OSiMe3]5"[Cd18I17(PSiMe3)12], and [N(Et)3C4H8OSiMe3]5[Cd18I17(PSiMe3)12]", "Angew. Chem. Int. Ed. Engl.", 1996, pp. 2215-2218, vol. 35, No. 19.

Bochmann, M. et al., "Synthesis of Some Alkyl Metal Selenolato Complexes of Zinc, Cadmium and Mercury, X-Ray Crystal Structure of Me, Hg, Se(2,4,6-Pri3,C6H2)", "Polyhedron", 1992, pp. 507-512, vol. 11, No. 5.

Bradley, D., et al., "Metallo-organic compounds containing metal-nitrogen bonds. Part I. Some dialkylamino-derivatives of titanium and Zirconium", "Journal of the Chemical Society", Oct. 1960, pp. 3857-3861.

Bradley, D., et al., "Metallo-organic compounds containing metal-nitrogen bonds: Part III. Dialkylamino compounds of tantalum", "Canadian Journal of Chemistry", Jul. 1962, pp. 1355-1360, vol. 40, No. 7.

Bwembya, G., et al., "Phosphinochalcogenoic Amidato Complexes of Zinc and Cadmium as Novel Single-Source Precursors for the Deposition of Metal Selenide and Telluride Films", "Chemical Vapor Deposition", 1995, pp. 78-80, vol. 1, No. 3.

Carmalt, C., et al., "Synthesis of titanium(IV) guanidinate complexes and the formation of titanium carbonitride via low-pressure chemical vapor deposition", "Inorganic Chemistry", Jan. 7, 2005, pp. 615-619, vol. 44, No. 3.

Chen, T., et al., "Low temperature Deposition of Ge Thin Films with a Ge(II) Silylamido Source", "ECS Transactions", 2007, pp. 269-278, vol. 11, No. 7.

Cheng, H., et al., "Wet Etching of GE2SB2TE5 Films and Switching Properties of Resultant Phase Change Memory Cells", "Semiconductor Science and Technology", Sep. 26, 2005, pp. 1111-1115, vol. 20, No. 11.

Chiu, H., et al., "Deposition of tantalum nitride thin films from ethylimidotantalum complex", "Journal of Materials Science Letters", Jan. 1992, pp. 96-98, vol. 11, No. 2.

Cho, K., et al., "Designing PbSe Nanowires and Nanorings through Oriented Attachment of Nanoparticles", "J. Am. Chem. Soc.", Apr. 23, 2005, pp. 7140-7147, vol. 127.

Choi, B. et al., "Combined Atomic Layer and Chemical Vapor Deposition, and Selective Growth of Ge2Sb2Te5 Films on TiN/W Contact Plug", "Chem. Mater.", Aug. 14, 2007, pp. 4387-4389, vol. 19.

(56) References Cited

OTHER PUBLICATIONS

Choi, B., et al., "Cyclic PECVD of Ge2Sb2Te5 Films Using Metallorganic Sources", "Journal of the Electrochemical Society", Feb. 22, 2007, pp. H318-H324, vol. 154, No. 4.

Chorley, R., et al., "Subvalent Group 14 metal compounds XIV. The X-ray crystal structures of two monomeric Group 14 metal bisamides, Ge[N(SiMe3)2]2 and Sn[NC(Me)2(CH2)3CMe2]2", "Inorganica Chimica Acta", Aug.-Oct. 1992, pp. 203-209, vol. 198-200.

Cole-Hamilton, D., "MOVPE Mechanisms from studies of specially designed and labelled precursors", "Chem. Commun.", 1999, pp. 759-765.

Cummins, C., et al., "Synthesis of Terminal Vanadium(V) Imido, Oxo, Sulfido, Selenido, and Tellurido Complexes by Imido Group or Chalcogen Atom Transfer to Trigonal Monopyramidal", "Inorganic Chemistry", Mar. 30, 1994, pp. 1448-1457, vol. 33, No. 7.

Drake, J., et al., "Studies of Silyl and Germyl Group 6 Species. 5. Silyl and Germyl Derivatives of Methane- and Benzenetellurols", "Inorg. Chem.", 1980, pp. 1879-1883, vol. 19.

Foley, S., et al., "Facile Formation of Rare Terminal Chalcogenido Germanium Complexes with Alkylamidinates as Supporting Ligands", "J. Am. Chem. Soc.", Oct. 29, 1997, pp. 10359-10363, vol. 119, No. 43.

Foley, S., et al., "Synthesis and structural characterization of the first trialylguanidinate and hexahydropyramidinate complexes of tin", "Polyhedron", 2002, pp. 619-627, vol. 21.

Gehrhus, B., et al., "New Reactions of a Silylene: Insertion into M-N Bonds of M[N(SiMe3)2]2 (M = Ge, Sn, or Pb)", "Angew. Chem. Int. Ed. Engl.", 1997, pp. 2514-2516, vol. 36, No. 22.

Gordon, R., et al., "Silicon dimethylamido complexes and ammonia as precursors for the atmospheric pressure chemical vapor deposition of silicon nitride thin films", "Chem. Mater.", Sep. 1990, pp. 480-482, vol. 2, No. 5.

Green, S., et al., "Synthetic, structural and theoretical studies of amidinate and guanidinate stabilised germanium(I) dimers", "Chem. Commun.", Sep. 8, 2006, pp. 3978-3980.

Green, S., et al., "Complexes of an Anionic Gallium(I) N-Heterocyclic Carbene Analogue with Group 14 Element(II) Fragments: Synthetic, Structural and Theoretical Studies", "Inorganic Chem.", Aug. 3, 2006, pp. 7242-7251, vol. 45, No. 18.

Gumrukcu, I., et al., "Electron Spin Resonance of t-Alkyl-, Silyl-, and Germyl-aminyl Radicals and some Observations on the Amides MBr{N(SiMe3)2}3 (M=Ge, Sn, or Pb)", "J.C.S. Chem. Comm.", 1980, pp. 776-777.

Gupta, A., et al., "Triorganoantimony(V) complexes with internally functionallized oximes: synthetic, spectroscopic and structural aspects of [R3Sb(Br)L], [R3Sb(OH)L] and [R3SbL2], crystal and molecular structures of [Me3Sb{ON=C (Me)C4H3O}2], [Me3Sb{ON=C(Me)C4H3S}2], 2-OC4H3C(Me)=NOH and 2-SC4H3C(Me)=NOH", "Journal of Organometallic Chemistry", 2002, pp. 118-126, vol. 645.

Gynane, M., et al., "Subvalent Group 4B Metal Alkyls and Amides. Part 5. The Synthesis and Physical Properties of Thermally Stable Amides of Germanium(II), Tin(II), and Lead(II)", "J. Chem. Soc., Dalton Transactions", 1977, pp. 2004-2009.

Han, L., et al., "Extremely Facile Oxidative Addition of Silyl, Germyl, and Stannyl Tellurides and Other Chalcogenides to Platinum(0) Complexes, X-ray Structure of trans-Pt(4-PhC6H4Te)(SiMe3)(PEt3)2", "J. Am. Chem. Soc.", 1997, pp. 8133-8134, vol. 119.

Harris, D., et al., "Monomeric, Volatile Bivalent Amides of Group IVB Elements, M(NR12)2 and M(NR1R2)2 (M=Ge, Sn, or Pb; R1=Me3Si, R2=Me3C)", "J.C.S. Chem. Comm.", 1974, pp. 895-896.

Hatanpaa, T., et al., "Synthesis and characterisation of cyclopentadienyl complexes of barium: precursors for atomic layer deposition of BaTiO3", "Dalton Trans.", Mar. 22, 2004, pp. 1181-1188, vol. 8.

Herrmann, W., et al., "Stable Cyclic Germanediyls ('Cyclogermylenes'): Synthesis, Structure, Metal Complexes, and Thermolyses", "Angew. Chem. Int. Ed. Engl.", 1992, pp. 1485-1488, vol. 31, No. 11.

Herrmann, W., et al., "Volatile Metal Alkoxides according to the Concept of Donor Functionalization", "Angew. Chem. Int. Ed. Engl.", 1995, pp. 2187-2206, vol. 34.

Hitchcock, P., et al., "Subvalent Group 14 Metal Compounds-XIII. Oxidative Addition Reactions of Germanium and Tin Amides With Sulphur, Selenium, Tellurium or MeOOCC=CCOOMe; X-Ray Structures of [Ge(NR2)2(mu-Te)]2 and Sn(NR2)2CC(OMe)OSn(NR2)2CC(OMe) O", "Polyhedron", 1991, pp. 1203-1213, vol. 10, No. 117.

Hitchcock, P., et al., "Synthesis and Structures of Bis[bis(trimethylsilyl)amido]-tin(iv) Cyclic Chalcogenides [{Sn[N (Si Me3)2]2(mu-E)}2] and a Heterobimetallic Analogue [{(Me3Si)2N}2Ge(mu-Te)2Sn-{N(SiMe3)2}2] (E = S, Se or Te", "J. Chem Soc. Dalton Trans.", 1995, pp. 3179-3187.

Hor, Y., et al., "Superconducting NbSe2 nanowires and nanoribbons converted from NbSe3 nanostructures", "Applied Physics Letters", Sep. 27, 2005, pp. 13, vol. 87, No. 142506.

Hudgens, S., et al., "Overview of Phase Change Chalcogenide Nonvolatile Memory Technology", "MRS Bulletin", Nov. 2004, pp. 1-5.

George, T., et al., "Amino-derivatives of Metals and Metalloids. Part II. Amino-stannylation of Unsaturated Substrates, and the Infrared Spectra and Structures of Carbarmato—and Dithiocarbamato—trimethylstannanes and Related Compounds", "J. Chemical Society", 1965, pp. 2157-2165, No. 385.

Weller, H., "Self-organized Superlattices of Nanoparticles", "Angew. Chem. Int. Ed. Engl.", 1996, pp. 1079-1081, vol. 35, No. 10.

Weller, H., "Colloidal Semiconductor Q-Particles: Chemistry in the Transition Region Between Solid State and Molecules", "Angew. Chem. Int. Ed. Engl.", 1993, pp. 41-53, vol. 32.

Just, O., et al., "Synthesis and Single-Crystal X-ray Diffraction Examination of a Structurally Homologous Series of Tetracoordinate Heteroleptic Anionic Lanthanide Complexes: Ln{N[Si(CH3)2CH2CH2Si(CH3)2]}3(i-Cl)Li(L)3 [Ln = Sm, Eu, Gd, Tb, Dy, Ho, Er, Tm, Yb; (L)3 = (THF)3, (Et2O)3, (THF)2(Et2O)]", "Inorg. Chem.", Mar. 9, 2001, pp. 1751-1755, vol. 40, No. 8.

Kapoor, P., et al., "High surface area homogeneous nanocrystalline bimetallic oxides obtained by hydrolysis of bimetallic mu-oxo alkoxides", "J. Mater. Chem.", Jan. 14, 2003, pp. 410-414, vol. 13.

Karsch, H., et al., "Bis(amidinate) Complexes of Silicon and Germanium", "Eur. J. Inorg. Chemistry", Apr. 1998, pp. 433-436, vol. 4.

Kim, R., et al., "Structural Properties of Ge2Sb2Te5 thin films by metal organic chemical vapor deposition for phase change memory applications", "Applied Physics Letters", Sep. 6, 2006, pp. 1-3, vol. 89, No. 102107.

Kim, S., et al., "Electrical Properties and Crystal Structures of Nitrogen-Doped Ge2Sb2Te5 Thin Film for Phase Change Memory", "Thin Solid Films", Dec. 22, 2004, pp. 322-326, vol. 469-470.

Kuchta, M., et al., "Multiple Bonding Between Germanium and the Chalcogens: The Syntheses and Structures of the Terminal Chalogenido Complexes (q4-Me8taa)GeE (E = S, Se, Te)", "J. Chem. Soc. Chem. Commun.", 1994, pp. 1351-1352.

Kuchta, M., et al., "Comparison of the reactivity of germanium and tin terminal chalcogenido complexes: the syntheses of chalcogenolate and dichalcogenidostannacycopentane derivatives", "Chem. Commun.", 1996, pp. 1669-1670.

Kuehl, O., "N-heterocyclic germylenes and related compounds", "Coordination Chemistry Reviews", 2004, pp. 411-427, vol. 248.

Lappert, M., et al., "Monomeric Bivalent Group 4B Metal Dialkylamides M[NCMe2(CH2)3CMe2] (M = Ge or Sn), and the Structure of a Gaseous Disilylamide, Sn[N(SiMe3)2]2, by Gas Electron Diffraction", "J.C.S. Chem. Comm.", 1979, pp. 369-370, vol. 8.

Lappert, M., et al., "Monomeric, Coloured Germanium(II) and Tin(II) Di-t-Butylamides, and the Crystal and Molecular Structure of Ge(NCMe2[CH2]3CMe2)2", "J.C.S. Chem. Comm.", 1980, pp. 621-622, vol. 13.

Lee, J., et al., "GeSbTe deposition for the PRAM application", "Applied Surface Science", Feb. 2007, pp. 3969-3976, vol. 253, No. 8.

(56) References Cited

OTHER PUBLICATIONS

Leskela, M., et al., "Atomic layer deposition chemistry: recent developments and future challenges", "Angew. Chem. Int. Ed.", Nov. 24, 2003, pp. 5548-5554, vol. 42, No. 45.
Macomber, D., et al., "(n5—Cyclopentadienyl)- and (n5-Pentamethylcyclopentadienyl)copper Compounds Containing Phosphine, Carbonyl, and eta2-Acetylenic Ligands", "J. Am. Chem. Soc.", 1983, pp. 5325-5329, vol. 105.
Maruyama, T., et al., "Silicon dioxide thin films prepared by chemical vapor deposition from tetrakis(diethylamino) silane and ozone", "Appl. Phys. Letters", May 23, 1994, pp. 2800-2802, vol. 64, No. 21.
Maruyama, T., "Electrical Characterization of Silicon Dioxide Thin Films Prepared by Chemical Vapor Deposition from Tetrakis(diethylamino)silane and Ozone", "Jpn. J. Appl. Phys.", Jul. 15, 1997, pp. L922-L925, vol. 36, Part 2, No. 7B.
Mathur, S., et al., "Germanium Nanowires and Core-Shell Nanostructures by Chemical Vapor Deposition of [Ge (C5H5)2]", "Chem. Mater.", May 15, 2004, pp. 2449-2456, vol. 16, No. 12.
Matsuda, I., et al., "Reactions of Group IV Organometallic Compounds: XXVIII. The Insertion Reactions of Benzoyl-Tert-Butylcarbodiimide With With Group IV Trimethylmetallylamines and the Preparation of Trimethyl-Silyl- and -Germyl-tert-Butyl-Carbodiimide", "Journal of Organometallic Chemistry", 1974, pp. 353-359, vol. 69.
Meller, A., et al., "Synthesis and Isolation of New Germanium(II) Compounds and of Free Germylenes", "Chem. Ber.", May 1985, pp. 2020-2029 (English Abstract), vol. 118, No. 5.
Metzler, N., et al., "Synthesis of a silylene-borane adduct and its slow conversion to a silylborane", "Chem. Commun.", 1996, pp. 2657-2658.
Neumann, W., "Germylenes and Stannylenes", "Chem. Rev.", 1991, pp. 311-334, vol. 91, Publisher: American Chemical Society.
Oakley, S., et al., "Structural consequences of the prohibition of hydrogen bonding in copper-guanidine systems", "Inorg. Chem.", Jul. 13, 2004, pp. 5168-5172, vol. 43, No. 16 (Abstract).
O'Brien, P., et al., "Single-molecule Precursor Chemistry for the Deposition of Chalcogenide(S or Se)-containing Compound Semiconductors by MOCVD and Related Methods", "J. Mater. Chem.", 1995, pp. 1761-1773, vol. 5, No. 11.
Ovshinsky, S., "Reversible Electrical Switching Phenomena in Disordered Structures", "Physical Review Letters", Nov. 11, 1968, pp. 1450-1455, vol. 21, No. 20.
Pickett, N., et al., "Gas-phase formation of zinc/cadmium chalcogenide cluster complexes and their solid-state thermal decomposition to form II-VI nanoparticulate material", "J. Mater. Chem.", 1998, pp. 2769-2776, vol. 8.
Privitera, S., et al., "Phase change mechanisms in Ge2Sb2Te5", "Journal of Applied Physics", Jul. 9, 2007, pp. 1-5, vol. 102, No. 013516.
Raj, P., et al., "Synthesis and characterization of the complex triorganoantimony (V) cations, R3SbL'2+ and R3Sb (L-L)2+", "Synthesis and Reactivity in Inorganic and Metal-Organic Chemistry", 1992, pp. 543-557 (Abstract), vol. 22, No. 5.
Raj, P., et al., "Synthesis and geometry of complex triorganoantimony(V) cations", "Synthesis and Reactivity in Inorganic and Metal-Organic Chemistry", 1992, pp. 1471-1494 (Abstract), vol. 22, No. 10.
Raoux, S., et al., "Influence of Dopants on the Crystallization Temperature, Crystal Structure, Resistance, and Threshold Field for Ge2Sb2Te5 and GeTe Phase Change Materials", "European/Phase Change and Ovonics Symposium", Sep. 4-6, 2011, pp. 1-8, Published in: Zuerich, Switzerland.
Raoux, S., et al., "Materials Engineering for Phase Change Random Access Memory", "11th Annual Non-Volatile Memory Technology Symposium (NVMTS)", Nov. 7-9, 2011, pp. 1-5.
Ren, H., et al., "Synthesis and structures of cyclopentadienyl N-heterocyclic carbene copper(I) complexes", "Journal of Organometallic Chemistry", Jun. 21, 2006, pp. 4109-4113, vol. 691.
Richardson, M., et al., "Volatile rare earth chelates of 1,1,1,5,5,5-hexafluoro-2,4-pentanedione and 1,1,1,2,2,3,3,7,7,7-decafluoro-4,6-heptanedione", "Inorganic Chemistry", 1971, pp. 498-504, vol. 10, No. 3.
Ritch, J., et al., "The single molecular precursor approach to metal telluride thin films: imino-bis (diisopropylphosphine tellurides) as examples", "Chem. Soc. Rev.", Jun. 27, 2007, pp. 1622-1631, vol. 36.
Sasamori, T., et al., "Reactions of a Germacyclopropabenzene with Elemental Chalcogens: Syntheses and Structures of a Series of Stable 2H-Benzo[c][1,2]chalcogenagermetes", "Organometallics", Jan. 14, 2005, pp. 612-618, vol. 24.
Schlecht, S., et al., "Direct Synthesis of (PhSe)4Ge and (PhTe)4Ge from Activated Hydrogenated Germanium—Crystal Structure and Twinning of (PhTe)4Ge", "Eur. J. Inorg. Chem.", 2003, pp. 1411-1415.
Shenai, D. et al., "Safer alternative liquid germanium precursors for relaxed graded SiGe layers and strained silicon by MOVPE", "Journal of Crystal Growth", Jan. 8, 2007, pp. 172-175, vol. 298.
Shi, Y., et al., "Titanium dipyrrolylmethane derivatives: rapid intermolecular alkyne hydroamination", "Chem. Comm.", Mar. 7, 2003, pp. 586-587, No. 5.
Stauf, G., et al., "Low Temperature ALD of Germanium for Phase Change Memory Thin Films", "AVS 7th International Conference on Atomic Layer Deposition—ALD 2007", Jun. 24, 2007, pp. 1-8.
Steigerwald, M., et al., "Organometallic Synthesis of II-VI Semiconductors. 1. Formation and Decomposition of Bis(organotelluro)mercury and Bis(organotelluro)cadmium Compounds", "J. Am. Chem. Soc.", 1987, pp. 7200-7201, vol. 109.
Sun, S., et al., "Performance of MOCVD tantalum nitride diffusion barrier for copper metallization", "1995 Symposium on VLSI Technology Digest of Technical Papers", Jun. 1995, pp. 29-30.
Tsai, M., et al., "Metalorganic chemical vapor deposition of tantalum nitride by tertbutylimidotris(diethylamido) tantalum for advanced metallization", "Appl. Phys. Lett.", Aug. 21, 1995, pp. 1128-1130, vol. 67, No. 8.
Tsai, M., et al., "Metal-organic chemical vapor deposition of tantalum nitride barrier layers for ULSI applications", "Thin Solid Films", Dec. 1, 1995, pp. 531-536, vol. 270, No. 1-2.
Tsumuraya, T., et al., "Telluradigermiranes. A Novel Three-membered Ring System Containing Tellurium", "J. Chem. Soc. Chem. Commun.", 1990, pp. 1159-1160.
Veprek, S., et al., "Organometallic chemical vapor deposition of germanium from a cyclic germylene, 1,3-Di-tert-butyl-1,3,2-diazagermolidin-2-ylidine", "Chem. Mater.", 1996, pp. 825-831, vol. 8.
Vehkamaki, M., et al., "Atomic Layer Deposition of SrTiO3 Thin Films from a Novel Strontium Precursor-Strontium-bis(triisopropylcyclopentadienyl", "Chemical Vapor Deposition", Mar. 2001, pp. 75-80, vol. 7, No. 2.
Veith, M., et al., "Additionsreaktionen an intramolekular basenstabilisierte Ge=N- und Ge=S-Doppelbindungen", "Chem. Ber.", 1991, pp. 1135-1141 (English Abstract), vol. 124.
Veith, M., et al., "New perspectives in the tailoring of hetero (bi and tri-) metallic alkoxide derivatives", "Polyhedron", 1998, pp. 1005-1034, vol. 17, No. 5-6.
Veith, M., et al., "Molecular precursors for (nano) materials—a one step strategy", "J. Chem. Soc. Dalton. Trans.", May 20, 2002, pp. 2405-2412.
Horii, H., et al., "A Novel Cell Technology Using N-Doped GESBTE Films for Phase Change RAM", "Symposium on VLSI Technology Digest of Technical Papers", Jun. 10-12, 2003, pp. 177-178.

* cited by examiner

CONFORMAL GST DEPOSITION
THICKNESS AND COMPOSITION:
529A, 48.9% Ge, 8.5% Sb, 42.6% Te

XRD OF AN AMORPHOUS
AS-DEPOSITED FILM WITH ~50% Te
SAMPLE WITH FOLLOWING COMPOSITION:
308.1A, 44.8% Ge, 5.3% Sb, 49.8% Te

GST FILM Ge, Sb, Te, N AND C COMPOSITION ANALYSIS

RESISTANCE vs. TEMPERATURE MEASUREMENT
HOT CHUCK Tx MEASUREMENT, 1v DC BIAS

GERMANIUM ANTIMONY TELLURIDE MATERIALS AND DEVICES INCORPORATING SAME

CROSS-REFERENCE TO RELATED APPLICATIONS

This application is a U.S. national phase under the provisions of 35 U.S.C. §371 of International Patent Application No. PCT/US2010/035854 filed May 21, 2010, which in turn claims the benefit under the provisions of 35 USC 119 of U.S. Provisional Patent Application No. 61/317,829 filed Mar. 26, 2010 in the name of Jun-Fei Zheng for "Low Temperature GST Process and Films." The disclosures of said International Patent Application No. PCT/US2010/035854 and U.S. Provisional Patent Application No. 61/317,829 are hereby incorporated herein by reference in their respective entireties, for all purposes.

TECHNICAL FIELD

The present invention relates generally to germanium antimony telluride materials and to microelectronic devices and device structures incorporating same.

BACKGROUND

Materials such as germanium (Ge), antimony (Sb), and tellurium (Te) can be deposited onto substrates to form GeSbTe (GST) alloys as phase change memory (PCM) materials for use in semiconductor wafers or other semiconductor device structures. The conformal deposition of such materials in the forms of GST films is desirable for use in semiconductor device structures having high aspect ratio topographical features such as vias.

The deposition of GST materials to form films for PCM applications can be carried out using vapor deposition processes, such as chemical vapor deposition (CVD), metalorganic chemical vapor deposition (MOCVD), atomic layer deposition (ALD), or other vapor phase techniques.

PCM technology has the potential to expand commercially into dynamic random access memory (DRAM) and storage class memory (SCM) applications. These applications require long cycling endurance and fast write speeds while maintaining sufficient data retention character, as well as maintaining a low set resistance at small device scales and high aspect ratios. In this respect, alloy compositions and device structure have major and related impact on the PCM performance of the product device. The ability to conformally deposit GST films enables improved PCM cell heating efficiency with lower reset current, by minimizing the amount of GST film material in the cell and reducing heat loss.

Significant efforts are ongoing to improve performance of PCM alloy compositions and device performance (e.g., low reset current, device speed, cycle endurance), relative to that achieved by the GST225 alloy (atomic composition 22.5% Ge, 22.5% Sb, and 55% Te) currently used as a benchmark standard for PCM films and devices.

The processing and handling of Ge, Sb, and Te materials for applying GST films using CVD normally occurs at substrate temperatures above about 300 degrees C. The reason for this is that typical precursors for CVD processes generally utilize such high temperatures to promote molecular reactivity. However, amorphous or partially amorphous GST films are desired to attain the conformal deposition of the films and thus the substrate process temperature is preferred to be below the GST crystallization temperature, which is generally less than about 300 degrees C. This, however, has proven difficult, since tellurium precursors used in chemical vapor deposition processes are difficult to activate and only have suitable reactivity at temperatures typically higher than 300 degrees C. Further, because conventional CVD techniques utilize precursors in the deposition of the GST at processing temperatures of 300 degrees C. and above, the deposition of the GST film generally results in the crystallization of the film and thus is typically not conformal, particularly when Te is present in amounts above about 45% in the product GST film.

There is therefore a compelling need for improved GST films and phase change microelectronic devices utilizing same, e.g., for PCRAM applications.

SUMMARY

In one aspect, the present disclosure relates to a chalcogenide material selected from the group consisting of:
(i) material of the formula $Ge_xSb_yTe_zC_mN_n$
wherein:
x is about 0.1-0.6, y is about 0-0.7, z is about 0.2-0.9, m is about 0.02-0.20, and n is about 0.2-0.20;
(ii) material of the formula $Ge_xSb_yTe_zA_m$, wherein A is a dopant element selected from the group of N, C, In, Sn, and Se, and wherein x is from 0.1 to 0.6, y is from 0 to 0.7, z is from 0.2 to 0.9, and m is from 0 to 0.15;
(iii) material containing 27.5 to 33% germanium, with tellurium up to 55%, and the remainder being antimony;
(iv) 225 GeSbTe doped with germanium to yield germanium-rich GeSbTe material;
(v) germanium-enriched GeSbTe having a ratio of GeTe:$Sb_2Te_3$ that is in a range of from 3:1 to 10:1;
(vi) GeSbTe material containing 25 to 60% germanium, 8 to 25% antimony, and 40 to 55% tellurium; and
(vii) material selected from the group consisting of materials (ii)-(vi), as doped with at least one of carbon and nitrogen, wherein the amount of each is in a range of from 2 to 20%.

In another aspect the disclosure relates to a GST film having an atomic composition comprising from 0 to 50% Sb, from 50 to 80% Te, from 20 to 50% Ge, from 3 to 20% N and from 2 to 15% carbon, and wherein all atomic percentages of all components of the film total to 100 atomic %.

A further aspect of the invention relates to a GST thin film having an atomic composition comprising from 10 to 50% Sb, from 50 to 80% Te, from 10 to 50% Ge, from 3 to 20% N and from 3 to 20% carbon, and wherein all atomic percentages of all components of the film total to 100 atomic %.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 100, or 50 nanometers, depending on the specific application involved. As used herein, the term "thin film" means a layer of a material having a thickness below 1 micrometer.

As used herein and in the appended claims, the singular forms "a", "and", and "the" include plural referents unless the context clearly dictates otherwise.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range.

Other aspects, features and advantages of the disclosure will be more fully apparent from the ensuing description.

DETAILED DESCRIPTION

Figure 1:
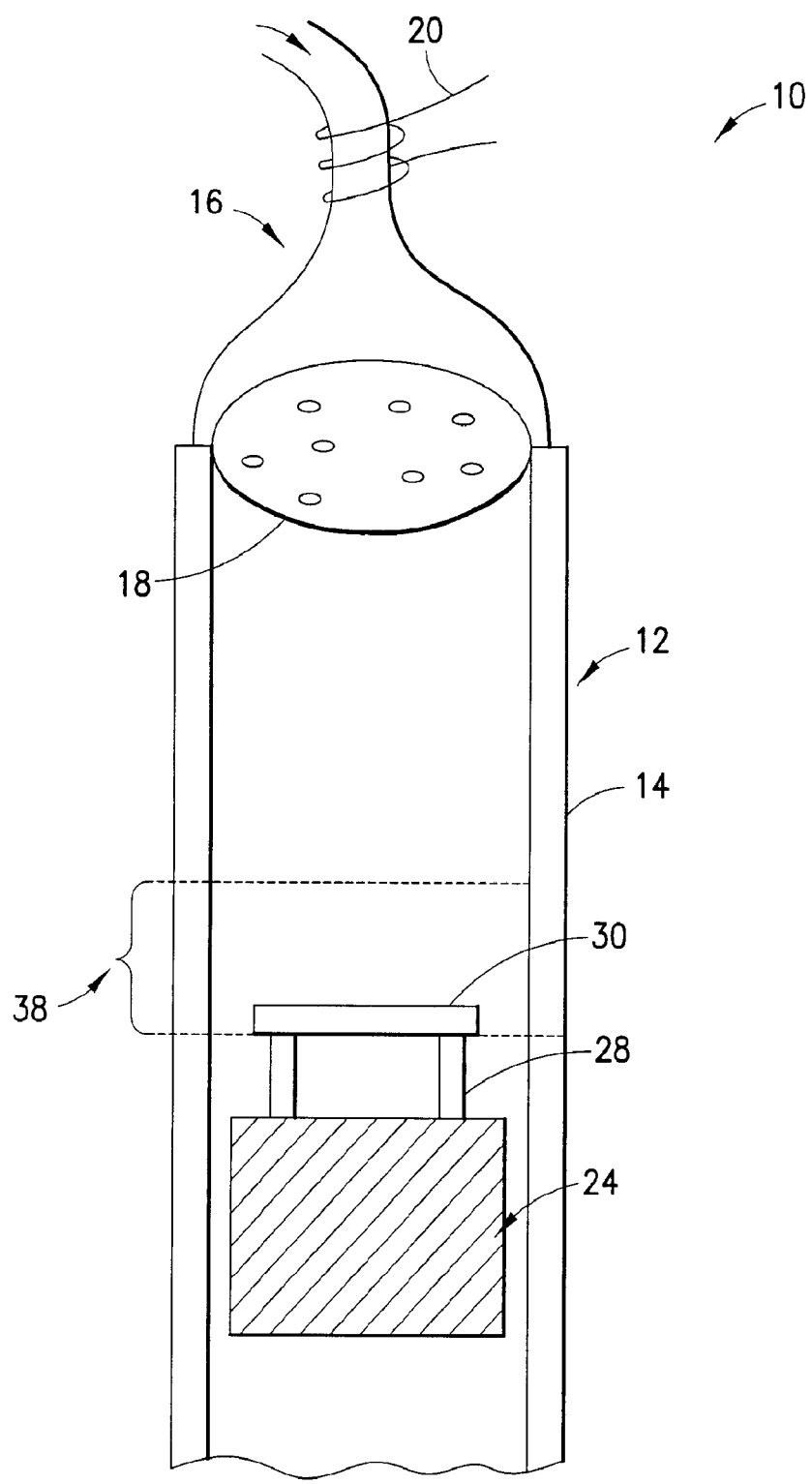
FIG. 1 is a schematic representation of a GST deposition process that can be employed to form the chalcogenide materials of the present disclosure.

All percentages expressed herein are atomic percentages.

Unless otherwise specified, all film compositions herein are specified in terms of atomic percentages of the film components, wherein the sum of all atomic percentages of all components in the film totals to 100 atomic %.

As used herein, the term CVD is defined as the deposition of a solid on a surface from a chemical precursor, and includes but is not limited to the following: Atmospheric pressure CVD (APCVD), Low pressure CVD (LPCVD), Ultrahigh vacuum CVD (UHVCVD), Aerosol-assisted CVD (AACVD), Digital CVD (DCVD), Direct liquid injection CVD (DLICVD), Microwave plasma-assisted CVD (MPCVD), Plasma-enhanced CVD (PECVD), Remote plasma-enhanced CVD (RPECVD), Atomic layer CVD (ALCVD), Hot wire CVD (HWCVD), Metalorganic chemical vapor deposition (MOCVD), Hybrid physical-chemical vapor deposition (HPCVD), Rapid thermal CVD (RTCVD), and Vapor phase epitaxy (VPE).

The present disclosure relates in a primary aspect to chalcogenide materials having utility for manufacture of semiconductor materials, devices and device precursor structures.

The chalcogenide materials can for example include those selected from the group consisting of:

(i) material of the formula $Ge_xSb_yTe_zC_mN_n$
wherein:
x is about 0.1-0.6, y is about 0-0.7, z is about 0.2-0.9, m is about 0.02-0.20, and n is about 0.02-0.20;

(ii) material of the formula $Ge_xSb_yTe_zA_m$, wherein A is a dopant element selected from the group of N, C, In, Sn, and Se, and wherein x is from 0.1 to 0.6, y is from 0 to 0.7, z is from 0.2 to 0.9, and m is from 0 to 0.15;

(iii) material containing 27.5 to 33% germanium, with tellurium up to 55%, and the remainder being antimony;

(iv) 225 GeSbTe doped with germanium to yield germanium-rich GeSbTe material;

(v) germanium-enriched GeSbTe having a ratio of GeTe:$Sb_2Te_3$ that is in a range of from 3:1 to 10:1;

(vi) GeSbTe material containing 25 to 60% germanium, 8 to 25% antimony, and 40 to 55% tellurium; and (vii) material selected from the group consisting of materials (ii)-(vi), as doped with at least one of carbon and nitrogen, wherein the amount of each is in a range of from 2 to 20%.

The material of the above-described type can include material in which $Ge_xSb_yTe_z$ therein has an atomic composition selected from the group consisting of:

(i) 22.5 at. % germanium, 22.5 at. % antimony and 55 at. % tellurium;
(ii) 27.5 to 32.5 at. % germanium and from 50 to 55 at. % tellurium;
(iii) 27 to 33% germanium, from 14 to 23% antimony and from 50 to 55% tellurium;
(iv) 27.2% germanium, 18.2% antimony and 54.5% tellurium;
(v) 30.7% germanium, 15.4% antimony, and 53.9% tellurium;
(vi) 33.3% germanium, 13.3% antimony and 53.3% tellurium;
(vii) 35.3% germanium, 11.8% antimony and 52.9% tellurium;
(viii) 36% germanium, 14% antimony and 50% tellurium;
(ix) 40% germanium, 8% antimony and 52% tellurium;
(x) 40% germanium, 5% antimony and 55% tellurium;
(xi) 30% germanium, 19% antimony and 51% tellurium;
(xii) 30% germanium, 16% antimony and 54% tellurium; and
(xiii) 32% germanium, 14% antimony and 54% tellurium.

GST materials of the present disclosures can be doped, e.g., with carbon and/or nitrogen. In various embodiments, the material is doped with carbon at 2 to 20 at. %, or at 3 to 20 at. %, or at 2 to 15 at. %, or at 2 to 10 at. %, or at 3 to 10 at. %, or at 2 to 6 at. %. Likewise, the material can be doped with nitrogen at 2 to 20 at. %, or at 3 to 20 at. %, or at 3 to 15 at. %, or at 3 to 12 at. %, or at 3 to 10 at. %, or at 5 to 10 at. %. The specific dopant levels can be readily determined within the skill of the art, based on the present disclosure, by conducting doping at varying levels and characterizing the resulting films as to their characteristics and performance qualities.

The GST materials of the present disclosure can be conformally coated on substrates, e.g., microelectronic device or device precursor structure substrates, to form microelectronic devices including such material. The microelectronic device can include a phase change memory cell, or a memory device.

One highly advantageous GST film composition for such purpose comprises from 0 to 50% Sb, from 50 to 80% Te, from 20 to 50% Ge, from 3 to 20% N and from 2 to 15% carbon, and wherein all atomic percentages of all components of the film total to 100 atomic %.

Another advantageous GST film composition useful for the foregoing applications comprises from 10 to 50% Sb, from 50 to 80% Te, from 10 to 50% Ge, from 3 to 20% N and from 3 to 20% carbon, and wherein all atomic percentages of all components of the film total to 100 atomic %.

As one embodiment of the present disclosure, FIG. 1 depicts a system for producing and depositing low temperature GST materials is generally designated by the reference number 10 and hereinafter referred to as "system 10." In the process of using system 10, GST materials comprising reactants are deposited onto a substrate (hereinafter referred to as "wafer") as a film to form a phase change material (PCM) device.

The system 10 comprises a deposition chamber 12 or furnace defined by at least one wall 14. However, the present invention is not limited in this regard, as other configurations are possible. The inner surface of the wall of the deposition chamber 12 defines a heat shield 14. An inlet 16 is located in the deposition chamber 12 to allow for the introduction of the reactants (e.g., precursors, co-reactants, and inert materials such as carriers) into the system 10. The inlet 16 is located in communication with any suitable source, such as a ProEvap® carrier gas operating system (ATMI, Inc., Danbury, Conn., USA), from which the reactants are delivered. A showerhead 18 is located downstream of the inlet 16 to facilitate the efficient dispersal and delivery of the reactants delivered from the source. The present invention is not limited to the use of a showerhead, however, as other similar devices are within the scope of this disclosure. A heating coil 20 or any other suitable heating device may be located at the inlet 16 to heat the reactants during delivery thereof from the source.

The reactants may be pre-cracking compositions, pre-reaction compositions, partial decomposition products, and/or other materials that are suitable for controllably altering reaction conditions in the deposition chamber to produce the desired film. Exemplary reactants include, but are not limited to, germanium n-butylamidinate (germanium precursor), tris(dimethylamido)antimony (antimony precursor), and diterbutyltelluride (tellurium precursor).

A heating stage 24 is located in the deposition chamber 12. The heating stage 24 can be heated using any suitable source of energy to cause heat to radiate therefrom. For example, the heating stage 24 may be heated using an electric current. The present invention is not so limited, however, as the heating stage 24 can be heated using other means.

The heating stage 24 comprises one or more support pins 28 that extend therethrough, each support pins being configured to support a wafer 30 on which the GST materials are deposited. Any suitable number of support pins 28 can be used to support the wafer 30. For example, three support pins 28 arranged in a triangular pattern can be used. The present invention is not limited to any particular number of support pins 28 or any particular arrangement thereof, as any number and arrangement of support pins is within the scope of the present disclosure. Preferably, the areas of contact between the support pins 28 and the wafer 30 are minimal.

The support pins 28 may be fixed relative to the heating stage 24, or they may be extendable therethrough. In embodiments in which the support pins 28 are extendable through the heating stage, the wafer 30 may be elevated or lowered as desired.

In one process of using the system 10, a gas including one or more of Ge, Sb, and Te precursors and optionally one or more co-reactant gases are delivered into the deposition chamber 12 from the source via inlet 16. The wafer 30 is located at a distance of about 5 mm from the heating stage 24 and is, therefore, radiantly heated. Heat radiated from the heating stage 24 also heats the heat shield 14.

During and possibly prior to the deposition of materials, the precursors are activated in an activation region 38 of the deposition chamber 12. When the temperature of the heating stage 24 is about 320 degrees C. to about 400 degrees C., the temperature of the wafer 30 is about 160 degrees C. to about 240 degrees C. Because the heat shield 14 is in close proximity to the heating stage, the temperature of the heat shield 14 in the activation region 38 above wafer 40 has a temperature that is higher than that of the wafer. Preferably, the temperature of the heating stage 24 is maintained such that the temperature of the activation region 38 is about 100 degrees C. higher than that of the wafer 30.

Although the activation region 38 may be located anywhere in the deposition chamber 12 such that the source materials are activated, location of the activation region on the surface of the wafer means that the deposition of GST film is substantially a surface reaction. The present invention is not so limited, however, as there may be a gas phase reaction of source material prior to deposition on the wafer 30. However, any such gas phase reaction should be minimized.

The pressure in the deposition chamber 12 is about 1 Torr to about 10 Torr, and preferably about 2.5 Torr. The present invention is not limited in this regard, however, as other pressures may be maintained in the deposition chamber 12 without departing from the broader aspects of the processes and apparatuses disclosed herein.

Figure 2A:
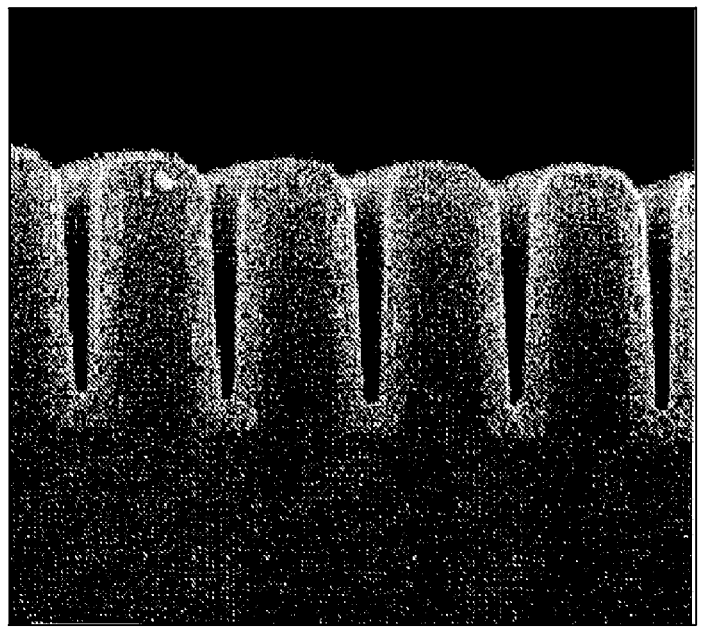
FIG. 2a is a representation illustrating the conformal deposition of GST film with a Ge:Sb:Te composition close to 4:1:5.
Figure 2B:
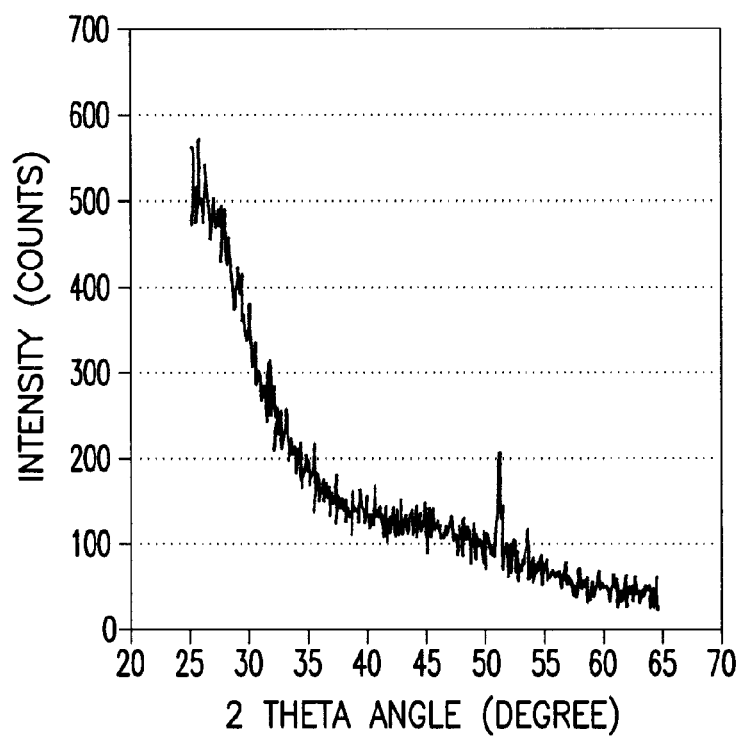
FIG. 2b is an X-ray diffraction scan pattern of a GST film with a Ge:Sb:Te composition close to 4:1:5 and showing amorphous characteristics.

As is shown in FIG. 1, by supporting the wafer 30 using the support pins 28, the temperature to which the wafer is subjected is reduced (relative to the heating stage 24). As a result, a composition of GST having a Te content greater than 50% by increasing the influx of Te precursors without leading to the formation of crystalline GST films has been achieved, as shown in FIG. 2a. In FIG. 2b, an X-ray diffraction pattern is shown for a similar GST composition. Table 1 below shows examples of many such films. Using this process, GST can be obtained with a Ge:Sb:Te ratio of 4:1:5, 2:2:5, or the like.

TABLE 1

| GST films with varying heating source temperatures and wafer temperatures. | | | | | | |
|---|---|---|---|---|---|---|
| Thickness (nm) | Ge % | Sb % | Te % | N % | Heating Stage temperature (degrees C.) | Wafer temperature (degrees C.) |
| 12.9 | 25.4 | 30.9 | 43.9 | not measured | 322 | 160 |
| 7.5 | 39.4 | 16.9 | 43.7 | not measured | 342 | 180 |
| 33.8 | 18 | 30.9 | 51.2 | not measured | 342 | 180 |
| 42.6 | 14.5 | 29.1 | 56.3 | 0 | 362 | 197 |
| 41.6 | 31.3 | 12.4 | 52.2 | 4.1 | 362 | 197 |
| 36.6 | 30.6 | 14.8 | 49.3 | 5.33 | 362 | 197 |
| 16 | 45.3 | 5.09 | 49.7 | not measured | 362 | 197 |
| 27 | 32.7 | 14.9 | 48.9 | 3.46 | 382 | 220 |
| 35 | 23 | 24 | 53 | 0 | 402 | 240 |
| 39 | 20 | 25 | 55 | 0 | 402 | 240 |
| 13.3 | 35.6 | 10.3 | 54.1 | not measured | 402 | 240 |
| 195 | 9 | 0.8 | 84 | 5.4 | 402 | 240 |

Figure 3:
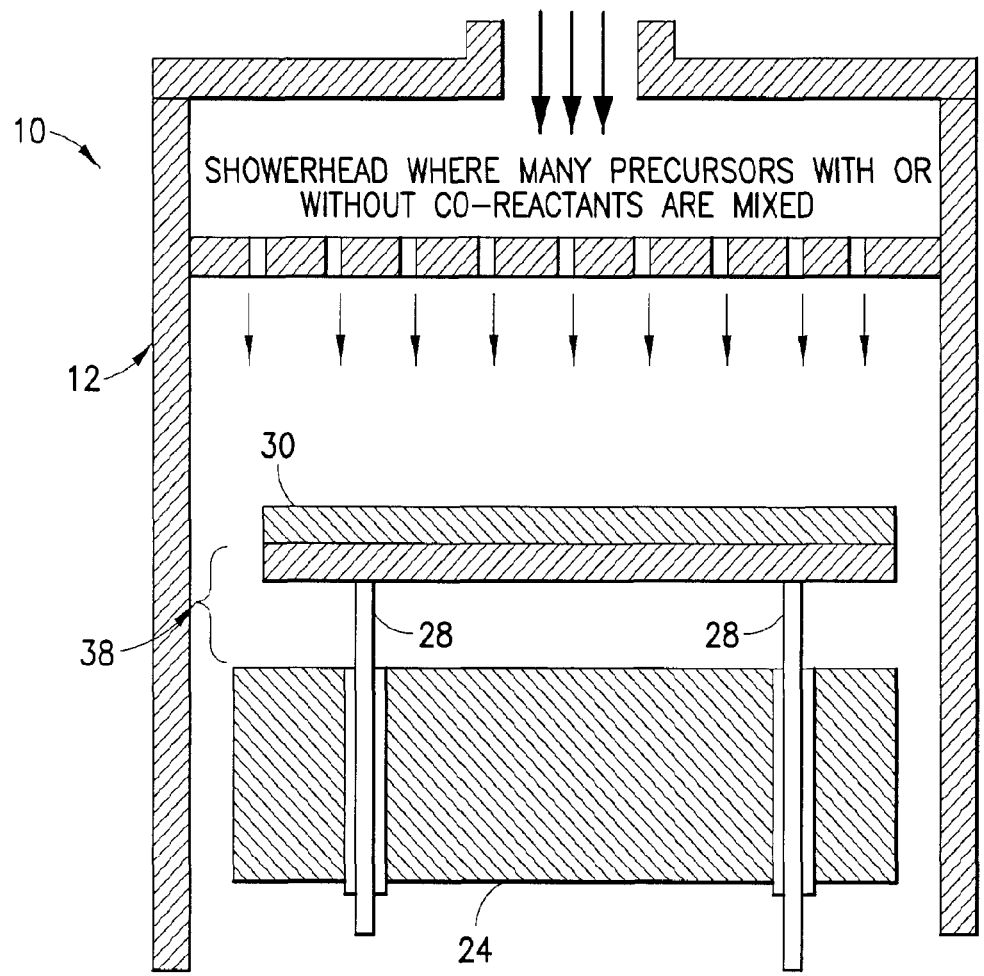
FIG. 3 is a schematic representation of another GST deposition process that can be used to form chalcogenide materials of the present disclosure.

As is shown in FIG. 3, the wafer 30 may be elevated by the support pins 28 and located thereon such that the device side of the wafer faces the heating stage 24. In such an embodiment, the device side of the wafer 30 is heated by thermal radiation to a temperature of about 180 degrees C. to about 240 degrees C. by the heating stage 24, which is at a temperature of about 340 degrees C. to about 420 degrees C.

Figure 4:
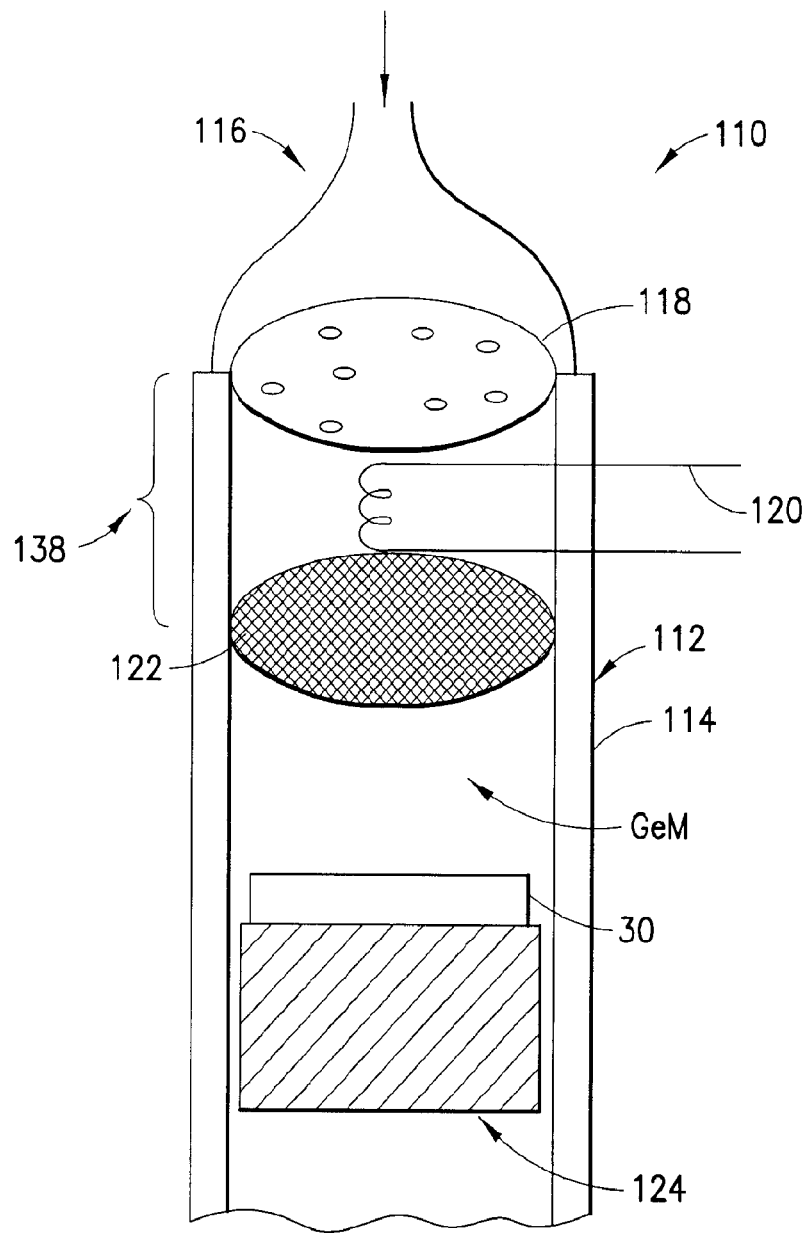
FIG. 4 is a schematic representation of another GST deposition process that can be used to form chalcogenide materials of the present disclosure.

In another embodiment of the present disclosure as is shown in FIG. 4, a system for producing and depositing low temperature GST materials is generally designated by the reference number 110 and hereinafter referred to as "system 110." In the process of using system 110, GST materials are again deposited onto a wafer 30 to form a PCM device.

In the system 110, a deposition chamber 112 is defined by at least one wall 114, the inner surface of which defines a heat shield. An inlet 116 is located in the deposition chamber 112 to allow for the introduction of precursors, co-reactants, and inert materials. The inlet 116 is located in communication with any suitable source, such as a ProEvap® carrier gas operating system from which the precursors and/or other materials are delivered. A showerhead 118 or similar device is located between the inlet 116 and the wall 114 of the deposition chamber 112 to facilitate the efficient dispersal and delivery of the precursors and/or other materials delivered from the source. A screen 122 is located downstream of the showerhead 118. The screen 122 may be a copper mesh that is operably associated with a heating mean 120 to distribute heat at a substantially uniform temperature throughout the cross-sectional area of the path through which the precursors and co-reactants flow. The present invention is not limited in this regard, however, as other materials may comprise the screen. The volume between the showerhead 118 and the screen 122 defines an activation region 138, which includes the heating means 120.

The deposition chamber 112 includes a heating stage 124 located therein. The heating stage 124 can be heated using any suitable source of energy. The wafer 30 is located on the heating stage 124.

In one process of using the system 110, a source gas including the precursors and optionally one or more co-reactant gases are delivered into the deposition chamber 112 via inlet 116. After passing through the showerhead 118 and entering the activation region 138, the source gas is heated via the heating means 120, thereby activating the precursors before being deposited on the wafer 30. As the heated source gas passes through the screen 122, the heated source gas is substantially uniformly and evenly dispersed.

As is shown in FIG. 4, by activating the precursors in the activation region 138 prior to deposition onto the wafer 30 in the form of a film, some degree of gas phase reaction is affected. However, in the system 110, the gas phase reaction should be minimized. The final film deposition is preferably the result of a surface reaction that also occurs as the film is deposited onto the wafer 30. As is shown in Table 2 below, the reaction can be carried out at wafer temperatures as low as 150 degrees C. and activation region temperatures as low as 200 degrees C. Raising the wafer temperature to 200 degrees C. while the activation zone temperature is 200 degrees C. can also lead to the film formation. However, without the 200 degrees C. activation zone, a wafer temperature of 200 degrees C. alone will not provide the film properties and beneficial characteristics that are most desirable for GST film formation, particularly for the desired high Te GST formation.

TABLE 2

Process Results based on configuration of FIG. 4

| Experimental Run # | Thickness (A) | Ge % | Sb % | Te % | Activation region temperature (degrees C.) | Wafer temperature (degrees C.) |
|---|---|---|---|---|---|---|
| #3031 | 101.8 | 24.7 | 22.3 | 53 | 220 | 150 |
| #3032 | 67 | 29.6 | 11.2 | 67 | 220 | 150 |
| #3033 | 42.7 | 35 | 9.4 | 55.8 | 220 | 150 |
| #3034 | 57 | 30.1 | 28.5 | 41.4 | 220 | 130 |
| #3035 | 79.7 | 18 | 31.7 | 50.3 | 200 | 200 |
| #3036 | 58.8 | 30.1 | 28 | 58.8 | 220 | 150 |

Figure 5:
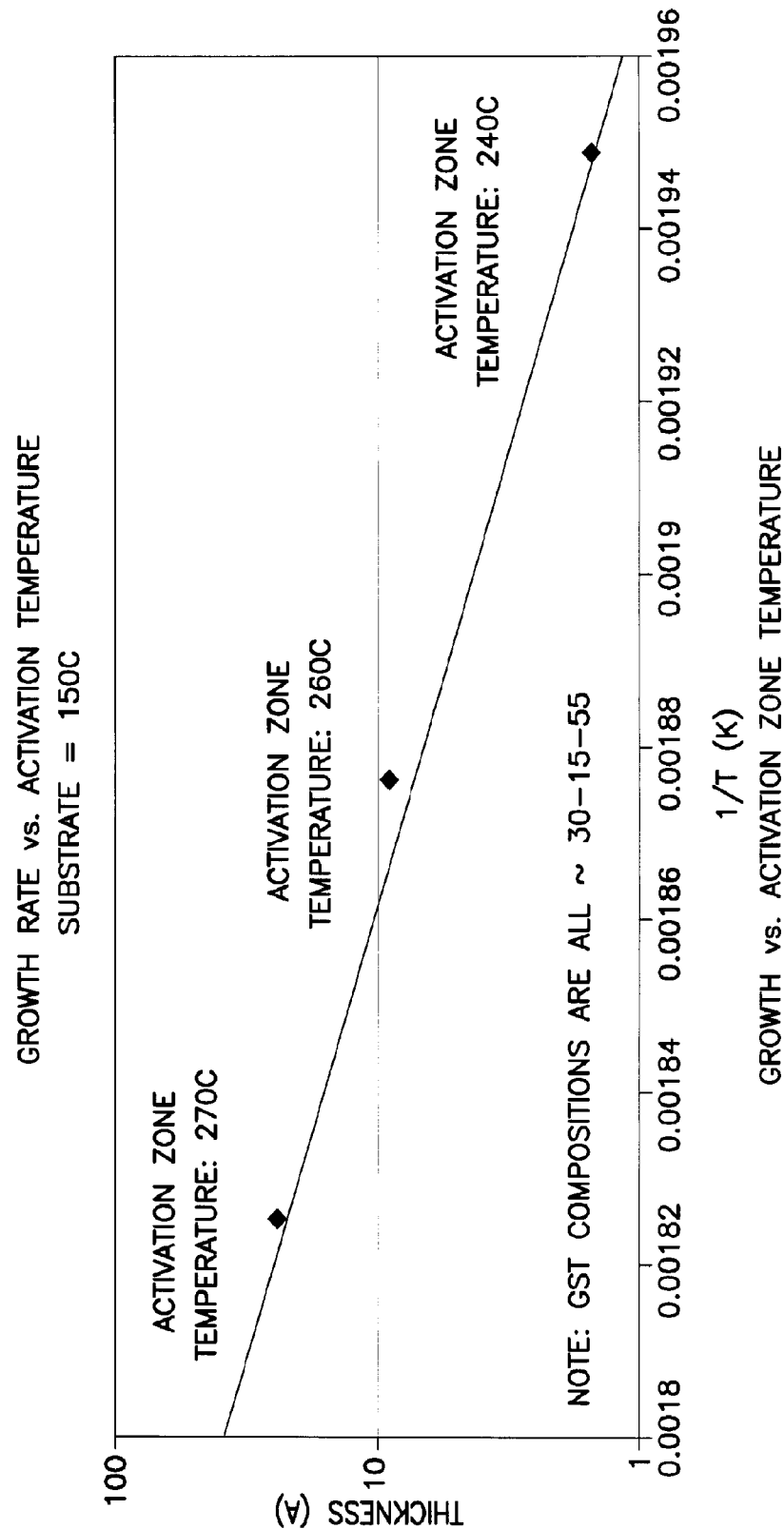
FIG. 5 is a graphical representation of growth rate of a GST composition versus the inverse of the activation region temperature.
Figure 6:
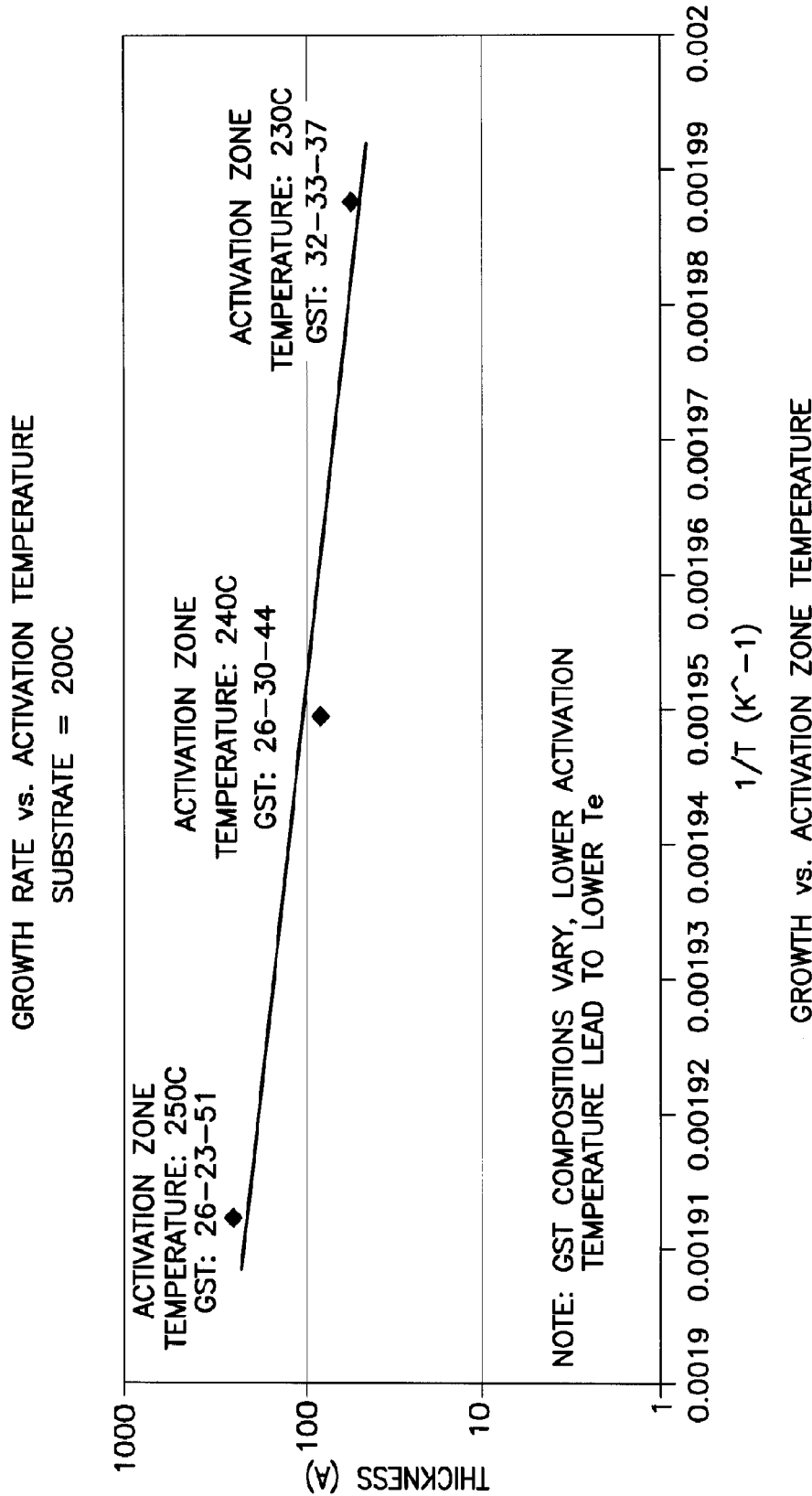
FIG. 6 is a graphical representation of growth rate of a GST composition versus the inverse of the activation region temperature.

In FIG. 5, the growth (in terms of thickness measured in Angstroms) of the film deposited on the wafer 30 is plotted versus the reciprocal of temperature for a GST composition having the ratios of 30:15:55. As can be seen, the growth rate decreases as the temperature in the activation region is decreased from 270 degrees C. to 240 degrees C. when the wafer is maintained at 150 degrees C. In FIG. 6, when the wafer 30 is 200 degrees C., a similar growth rate decrease is observed, thereby indicating that lower activation region temperatures lead to lower amounts of Te deposited.

Not all the precursors or co-reactants need be activated in the activation region 138. Each precursor and co-reactant can be activated separately at different temperatures to maximize the efficiency of the deposition of the film. The separate activation may further avoid the over activation of less stable precursors and thus avoid resulting in undesirable precursor by products or the premature consumption of the precursors by deposition (such as the formation of particles via gas phase reaction). In particular, one or more components of the source gas may be added downstream of the activation region 138. For example, in the configuration of the system 110 as shown in FIG. 4, the Te and Sb precursors and co-reactants are passed through the activation region 138 with the germanium precursor (GeM) being added downstream of the activation region 138. In doing so, the temperature of the germanium precursor can be controlled independently of the temperatures of other precursors and/or co-reactants, and a deposition process can be obtained in which the temperature of the wafer 30 can be about 110 degrees C. and the temperature in the activation region 138 can be as low as about 186 degrees C., as shown in Table 3.

TABLE 3

Deposition results with internal GeM source

| Run | Ge % | Sb % | Te % | Thickness | Activation region temperature (degrees C.) | Wafer temperature (degrees C.) |
|---|---|---|---|---|---|---|
| 3031 | 24.7 | 22.3 | 53.0 | 101.8 | 220 (heating coil 0.5 in. above wafer) | 150 |
| 3032 | 29.6 | 11.2 | 59.2 | 67 | 220 | 150 |
| 3033 | 35.0 | 9.25 | 55.8 | 42.7 | 220 | 130 |
| 3034 | 30.1 | 28.5 | 41.4 | 56.6 | 186 | 125 |
| 3035 | 18.0 | 31.7 | 50.3 | 79.7 | 200 | 200 |
| 3036 | 30.1 | 28.0 | 41.9 | 58.8 | 186 | 110 |

Figure 7:
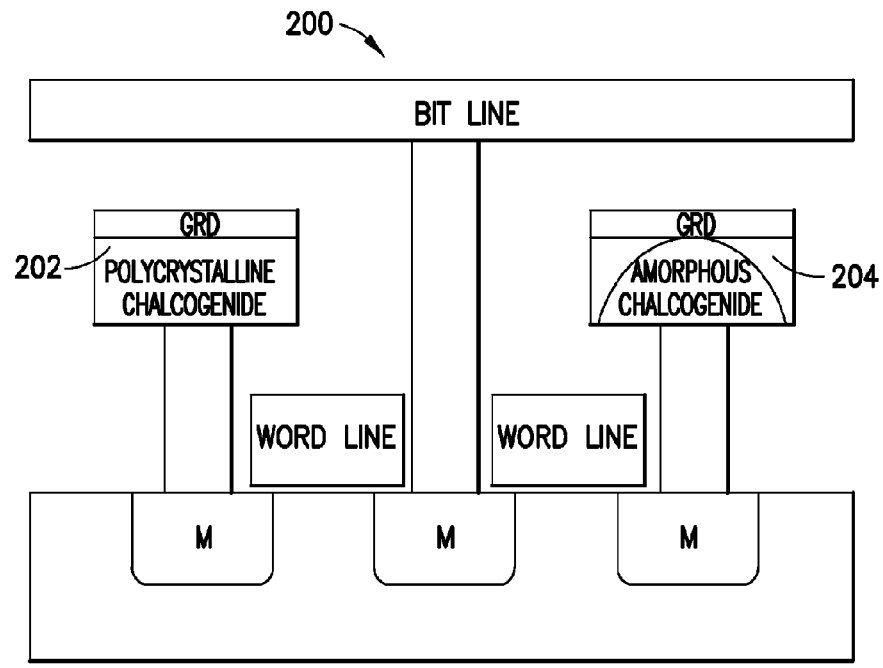
FIG. 7 is a schematic representation of a phase change memory cell device including chalcogenide material of the present disclosure.

FIG. 7 is a schematic representation of a phase change memory cell device 200 including chalcogenide material of the present disclosure as phase change memory elements 202 and 204. The cell device includes bit line and word line elements, and includes phase change memory element 202 in a polycrystalline state, and the phase change memory element 204 in an amorphous state.

It will be appreciated that the phase change material of the present disclosure can be provided in thin film and other conformations, and can be utilized in a variety of microelectronic device applications.

In any embodiment, the precursors are activated together with co-reactants by being heated, thereby providing for increased reactivity in the activation regions. The passage of the precursors and co-reactants along the length of the activation regions partly determines the degree of reactivity of the precursors. Furthermore, the heating element(s) can be located inside the heating stages of the deposition chambers, or they can be located in the showerhead upstream of the substrate, upstream of the showerhead and downstream of the inlet, or even further upstream in the inlet through which the precursors and co-reactants are introduced. Multiple heating sources can be used for achieving uniform thermal activations of precursors.

From a process aspect, the Ge, Sb, and Te precursor vapors can be used with or without co-reactants such as ammonia gas, hydrogen, nitrogen, or other suitable gases. A gas flow rate can be about 20 to about 200 standard cubic centimeter per minute (sccm), particularly for a one inch size substrate (wafer coupon). Gas flow rates are scaled up accordingly for larger size substrates (e.g., 300 mm or 8 inch wafers). Also, ammonium gas at 200 sccm can be diluted to 50 sccm using a hydrogen flow at 150 sccm to decrease the growth rate or to promote conformal fill benefits. Reduced process pressure from 2.5 Torr to lower values (e.g., to about 0.25 Torr) may also improve chemical mass transfer functions and provide for better uniformity and improved conformal deposition. On the other hand, higher pressures at 10 Torr can improve the growth rate due to higher molecular concentrations from the precursors being available. Diluent gases such as Ar, $N_2$, He, and combinations thereof can also be introduced from a bubbler or a ProEvap carrier gas operating system.

Figure 8A:
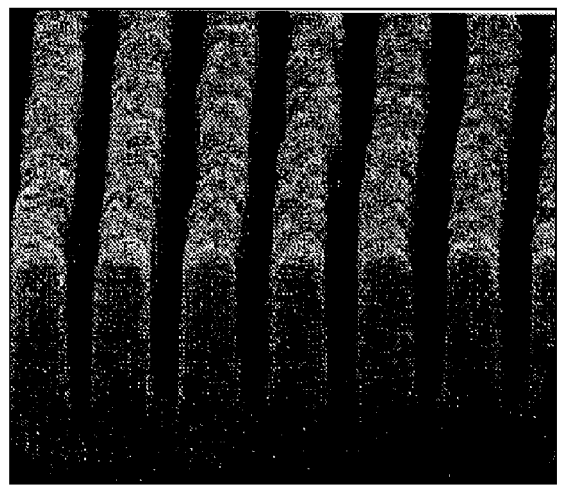
FIG. 8a is a representation illustrating the conformal deposition of GST film with a Ge:Sb:Te composition close to 2:2:5.
Figure 8B:
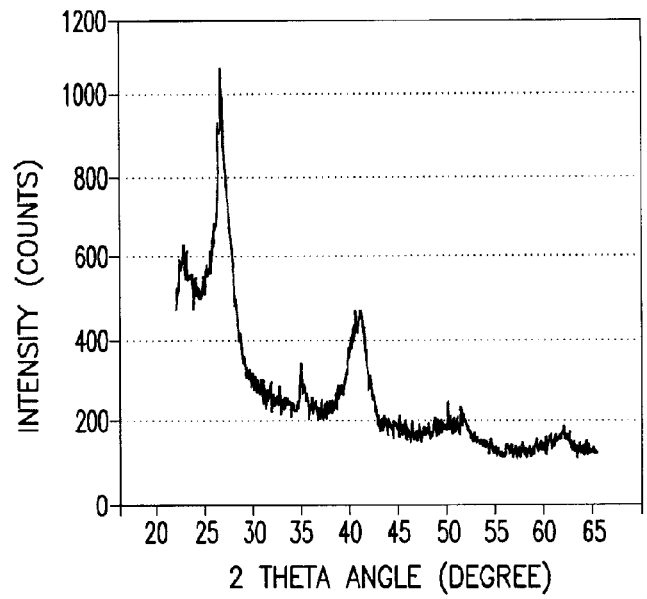
FIG. 8b is an X-ray diffraction scan pattern of a GST film with a Ge:Sb:Te composition close to 2:2:5 showing some crystalline characteristics.
Figure 9:
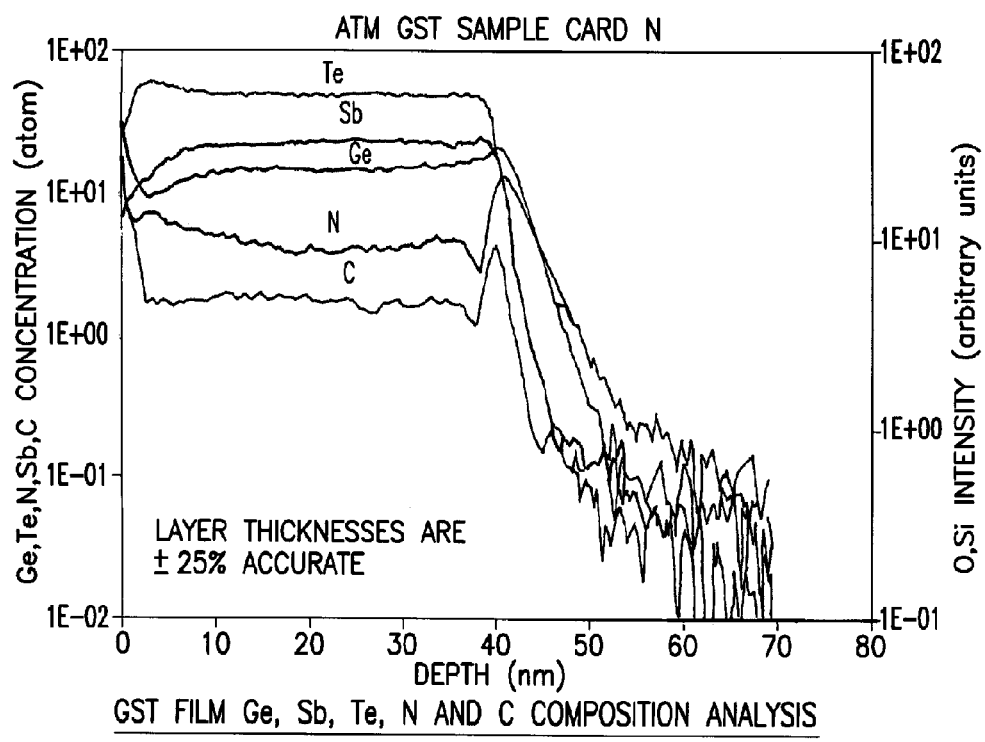
FIG. 9 is a graphical representation illustrating GST film having C and N.

In any embodiment, dopants such as N, C, In, Sn, Se, and combinations of the foregoing can be added to the GST film to produce a film having the formula $Ge_xSb_yTe_zA_m$, wherein A is the dopant element and wherein x is about 0.1-0.6, y is about 0-0.7, z is about 0.2-0.9, and m is about 0-0.15. As is shown in FIG. 8a, a scanning electron micrograph depiction of a GST film having a nitrogen dopant illustrates substantially conformal deposition deep into vias having high aspect ratios. The thickness of the film was 385.4 Angstroms, and the composition included 14.1% Ge, 26.4% Sb, 52.6% Te and 6.97% N. In FIG. 8b, an X-ray diffraction scan pattern of an as-grown film illustrates that the film is conformal and amorphous. In this XRD of the as-grown film, although crystalline peaks are shown, the sample is not fully crystalline, and the film is still conformal in character and shows characteristics of amorphous film. In FIG. 9, a Secondary Ion Mass Spectroscope (SIMS) scan of a GST film shows the Ge, Sb, Te, and N content distribution. Also as can be seen in FIG. 9, both carbon and nitrogen doping can co-exist in a GST film. Advantageously, carbon doping may reduce the reset current of the GST film, and nitrogen doping may improve conformality of the film. It is estimated that carbon doping reduces the reset current by 2-3 times.

In any embodiment, after the film is deposited, the wafer 30 may be subjected to an annealing process to reduce nitrogen content if it is deemed desirable to reduce the content of nitrogen at this stage. Table 4 below lists the experimental results.

TABLE 4

| | Composition of GST as-deposited | Composition of GST post 45 min annealing |
|---|---|---|
| Experiment #1 | 413.9A, 35.4% Ge, 3.6% Sb, 45.7% Te, 15.27% N | 45.9% Ge, 4.5% Sb, 47.1% Te 2.43% N after 350 C. 45 min annealing |
| Experiment #2 | 396.9A, 43.9% Ge, 4.88% Sb, 51.2% Te 11% N measured seperately | 368.3A, 44.3% Ge, 5.2% Sb, 49.6% Te, 0.91% N after 350 C. 45 min annealing |
| Experiment #3 | 355.3A, 36.2% Ge, 5.0% Sb, 42.4% Te, 16.31% N | 296.0A, 44.2% Ge, 6.6% Sb, 49.1% Te, 0.08% N after 350 C. 45 min annealing |

It will be recognized that the nitrogen content of the films after annealing are substantially reduced in relation to the nitrogen content of the as-deposited films. It will be correspondingly appreciated that the content of nitrogen, carbon and other film components is to be understood in the context of the description herein as referring to the film content after annealing and/or other post-deposition processing, unless otherwise expressly stated.

As discussed earlier herein, the systems and processes of the present disclosure can be implemented with activation of one or more precursors in the inlet of the deposition chamber. In other implementations, pre-activation of one or more of the precursors may be carried out in a pre-activation zone that is outside the deposition chamber, e.g., a separate pre-activation chamber that may for example be arranged in series or other flow arrangements with respect to the deposition chamber. Such dedicated pre-activation chamber can in many instances be more closely controlled as to its temperature, in relation to activation heating within the deposition chamber. This in turn may enable precursor activation to be achieved without excessive shift of the process baseline, and with increased capacity to avoid particle generation that may sometimes occur in the heating zone of the deposition chamber if temperature of the heating zone falls below desired operating conditions. Thus, the precursor can be activated in a dedicated activation chamber, e.g., a supply vessel in which the precursor is activated, at the time of dispensing for use.

The pre-activation chamber is desirably operated at substantially higher temperature than inside the chamber, in order to minimize susceptibility to particle formation. Pre-activation is typically used for one more precursors that are typically only partially decomposed at high temperature. By selectively activating these high temperature-decomposable precursors, without activating the other precursors that are able to be deposited at lower temperature without the need for pre-activation, highly energy-efficient operation can be attained that is productive of superior film formation on the substrate.

In some systems and processes, the Ge, Sb and Te precursors may be passed into the deposition chamber without pre-activation, but such pre-activation may be employed to make one or more of such precursors more effective in low temperature deposition.

In other implementations, multiple showerheads may be employed. For example, to showerheads may be utilized, one for pre-activated precursor(s) and another for non-pre-activated precursor(s). For such purpose, the two showerheads may be interlaced with one another and arranged to uniformly distribute both the pre-activated precursor and non-pre-activated precursor over the entire wafer surface.

Such multiple showerhead arrangements permit concurrent feeding of activated and non-activated precursors to the deposition chamber to enable low process temperature to be utilized for GST film formation. For example, a tellurium precursor can be activated by heating in an inlet passage to the deposition chamber, or alternatively in a dedicated activation chamber in which the requisite heating occurs to activate the precursor. The antimony and germanium precursors would not be activated, but would be introduced with the activated tellurium precursor to the deposition portion of the deposition chamber.

As another example, both tellurium and antimony precursors may be activated and the germanium may be passed into the deposition chamber without any activation prior to entering the deposition portion of the deposition chamber.

Processes of the present disclosure enable deposition of conformal high tellurium content GST films. Specific precursors are particularly beneficial in achieving such high tellurium content. For example, di-tertiary-butyl tellurium, $(tBu)_2Te$, can be activated to form di-tertiary-butyl ditellurium, tBu-Te—Te-tBu, as a stable thermal decomposition product. Such tellurium precursor tBu-Te—Te-tBu is advantageously utilized for GST film formation with a germanium precursor such as $Ge[Pr^iNC(n-Bu)NPr^i]_2$, denoted as "GeM" for ease of notation.

More generally, such precursor tBu-Te—Te-tBu can be used for low temperature deposition of tellurium-containing films, including GST films as well as $BiTe_3$ films and cadmium telluride (CdTe) films. CVD conformality can be enhanced utilizing such tellurium precursor.

More generally, CVD conformality can be enhanced through use of low deposition temperatures, chemical modification of the precursor chemistry and modification of the CVD process parameters. The use of $(tBu)_2Te$ results in higher tellurium concentrations in the product film when higher temperature zones are used to induce pre-reaction of the precursor. Such higher temperature zones can be in close proximity to the wafer surface, but are separate and distinct regions within the CVD deposition system. By partial pyrolytic decomposition of $(tBu)_2Te$ to form tBu-Te—Te-tBu, higher tellurium content films are achievable at lower substrate temperatures. Since incorporation of tellurium can have large effects on the electrical and thermal behavior of GST films, the ability to increase tellurium content of deposited films is highly advantageous.

The use of ditelluride precursors, of the form R—Te—Te—R, wherein each R is independently selected from methyl, ethyl, isopropyl, tertiary butyl and trimethylsilyl, is advantageous in producing high tellurium content films, in CVD, ALD, digital CVD and other vapor deposition processes, optionally including activation of such precursor in the deposition chamber or at the inlet to or even outside (upstream from) such chamber, be on the thermal activation occurring at the wafer surface in the deposition process. Such precursors can be used for forming GST films as well as other tellurium-containing films such as CdTe photovoltaic films and thermoelectric thin films based on II-VI telluride materials.

Co-reactants may be utilized with such ditelluride precursors, including, for example, inert gases, reducing gases (hydrogen, ammonia, diborane, silane, etc.), and the like.

The ditelluride precursors discussed above can be synthesized from the reaction of Cl—Te—Te—Cl with either RLi or Gringard reagents, wherein R is the same as previously described.

Figure 11:
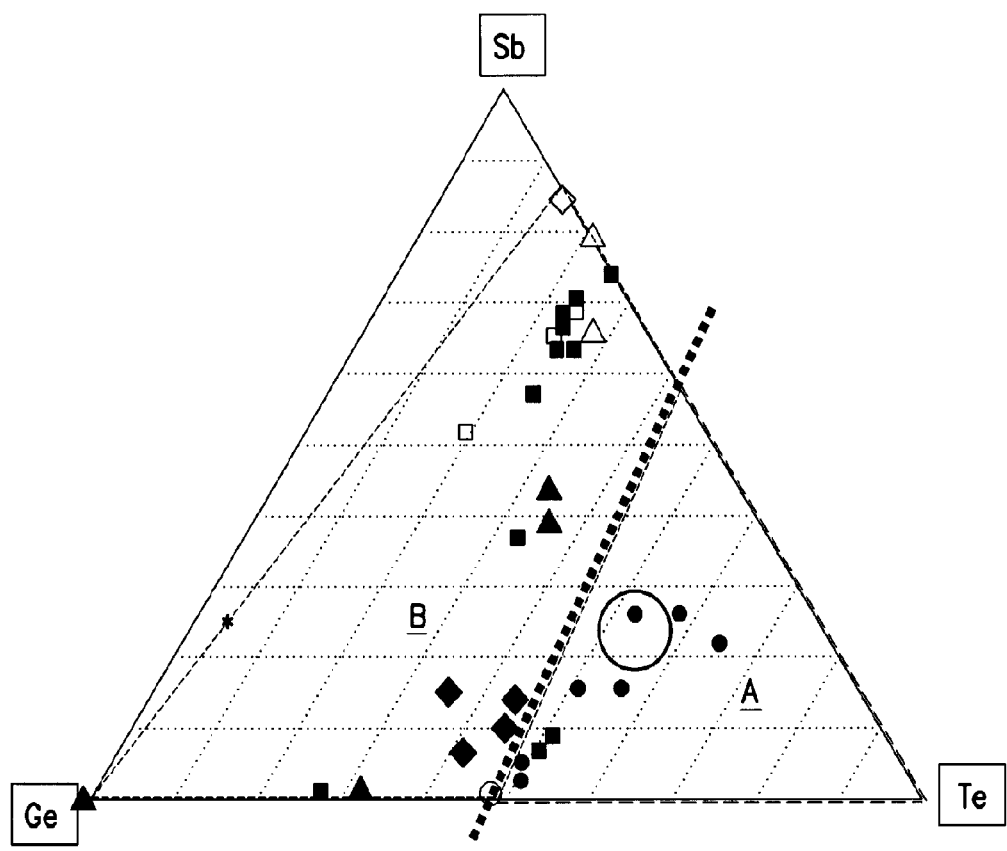
FIG. 11 is a compositional phase diagram reflecting relative amounts of germanium (Ge), antimony (Sb) and tellurium (Te) in GST films, showing a compositional region A for highly conformal MOCVD characterized by high tellurium content, as distinguished from region B reflecting lower tellurium content films.

FIG. 11 is a compositional phase diagram reflecting relative amounts of germanium (Ge), antimony (Sb) and tellurium (Te) in GST films, showing a compositional region A for highly conformal MOCVD characterized by high tellurium content, as distinguished from region B reflecting lower tellurium content films.

In this triangular phase diagram, region A shows data points associated with high tellurium content (>50 at. % Te) conformal MOCVD GST films, achievable by low temperature MOCVD processes of the present disclosure. The circled datum refers to a germanium-antimony-telluride composition containing from about 20 to about 25 atomic percent germanium, from about 20 to 25 atomic percent antimony, and from about 50 to 60 atomic percent of tellurium, e.g., 22.5 at. % germanium, 22.5 at. % antimony and 55 at. % tellurium, sometimes herein referred to as the "225 composition."

Figure 12:
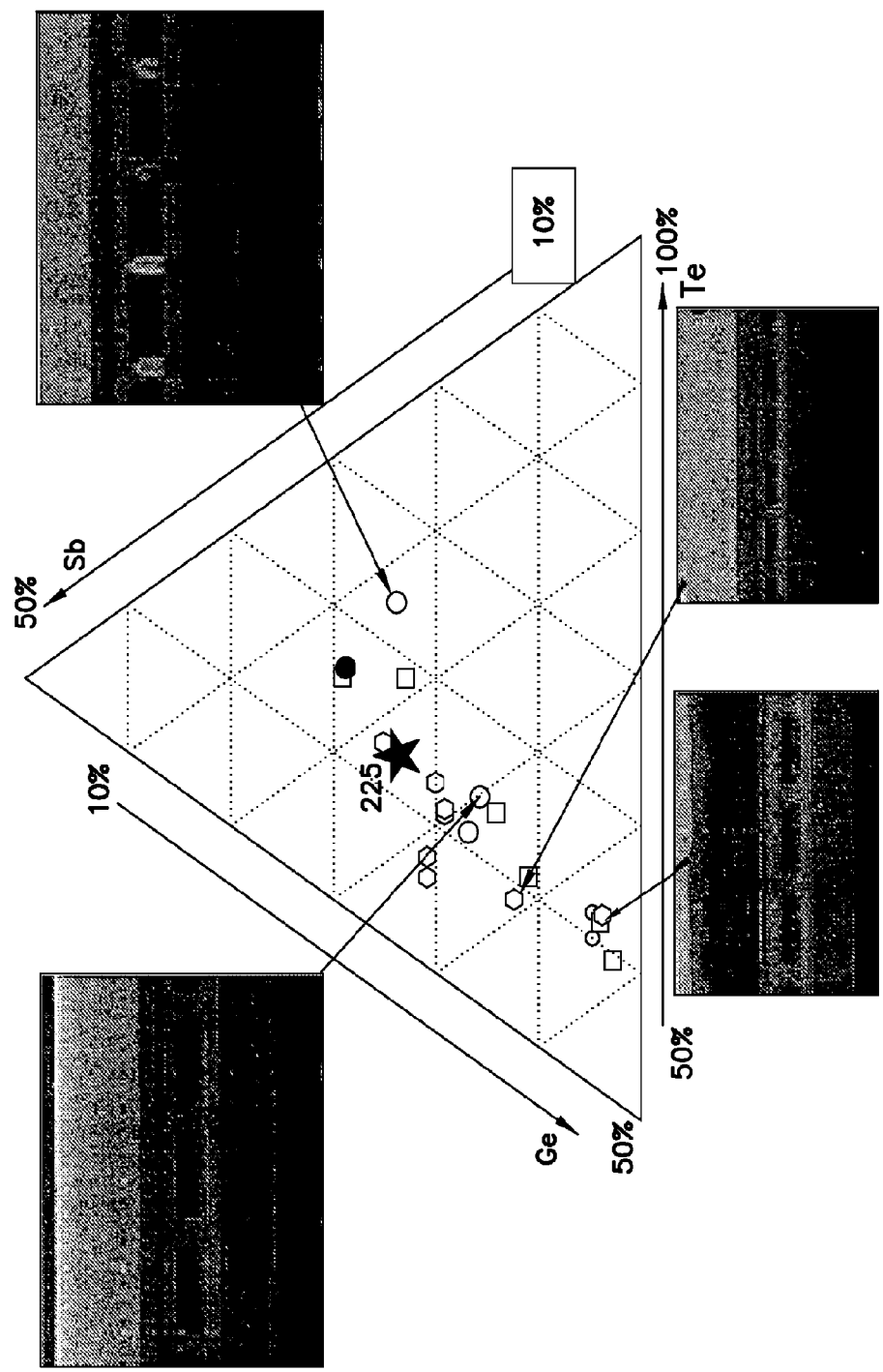
FIG. 12 is an enlarged view of region A of FIG. 11, showing data points associated with photomicrographs showing good morphology in high tellurium content films.

FIG. 12 is an enlarged view of region A of FIG. 11, showing data points associated with photomicrographs evidencing good morphology in high tellurium content films, and identifying the 225 composition by the number "225".

In a specific implementation, the present disclosure contemplates a vapor deposition process for depositing a GeTe-containing film on a substrate, comprising vaporizing a germanium-containing precursor and a tellurium-containing precursor to form a precursor vapor, contacting the germanium-containing precursor vapor with a substrate at a temperature that is below 250° C., and depositing on the substrate a conformal germanium-containing film. Such process may further comprise tellurium in the conformal germanium-containing film. The conformal film may be substantially amorphous. The germanium precursor may include a germanium alkyl amidinate. Other germanium precursors that may be usefully employed in forming germanium-containing films include Ge(IV) amides, Ge(IV) mixed alkyl/amide, Ge(II) amidinate, Ge(II) amide, Ge(IV) guanidinate, germylene, and Ge(II)Cp, wherein Cp is cyclopentadienyl. The tellurium precursor may comprise a di-alkyl tellurium precursor.

The substrate in the foregoing process may have temperature of from about 110° C. to about 250° C. In such process, the substrate temperature is desirably below the crystallization temperature of the multi-component germanium-containing film.

The low temperature MOCVD GST deposition process of the present disclosure has been determined to yield product GST films with equal to or better properties than those achievable by physical vapor deposition processes involving trench deposition of GST.

Set out below in Table 5 is a tabulation comparing performance of a physical vapor deposition (CVD) film deposited with a GST 225 composition containing containing 22.5% germanium, 22.5% antimony and 55% tellurium against CVD Composition A in which the film was deposited by chemical vapor deposition utilizing a low temperature process in accordance with the present invention, and a film noted below as "Best of CVD" based on a film deposited at using a precursor mixture including di-t-butyl telluride precursor, GeM (germanium n-butyl amidinate) germanium precursor and tris(dimethylamido)antimony precursor.

The Composition A film contained approximately 30% germanium, 20% antimony and 50% tellurium. The "Best of CVD" was based on an average of films of three different film compositions, including a first film composition containing approximately 30% germanium, 20% antimony and 50% tellurium, a second film composition containing 22.5% germanium, 22.5% antimony and 55% tellurium, and a third film composition containing from 40 to 45% germanium, from 5 to 10% antimony and from 50 to 55% tellurium.

TABLE 5

| Parameters | PVD GST 225 | CVD Comp A | Best of CVD |
|---|---|---|---|
| Void free fill at aspect ratio | <1:1 | >3:1 down to 35 nm | >5:1 down to 40 nm |
| $I_{rst}$ @ 70 nm | 0.8 mA | 0.5~1.0 mA | 0.2 mA |
| 10 Year Retention, crystallization Ea | 105° C. | 102° C. 2.2 eV | 125° C. 3.4 eV |
| Set speed | 200 ns | 260 ns | <50 ns '85% to 50% fail'-11 ns full fail time-30 ns |
| Cycle Endurance | $>1 \times 10^9$ | $>7 \times 10^9$ | $>1 \times 10^{10}$ |
| Drift coefficient | 0.1 | 0.1 | 0.1 |

The data shown in Table 5 show that chemical vapor deposition of GST films at low temperature in accordance with the present disclosure can achieve markedly better performance than is achieved by physical vapor deposition.

In the vapor deposition process of the present disclosure, the germanium-containing film can have the composition $Ge_xSb_yTe_zA_m$, wherein A is a dopant element selected from the group of N, C, In, Sn, and Se, and wherein x is from 0.1 to 0.6, y is from 0 to 0.7, z is from 0.2 to 0.9, and m is from 0 to 0.15. In various embodiments in which antimony is present, y can be from 0.1 to 0.7. In various embodiments in which the germanium-containing film is doped, m can be from 0.01 to 0.15.

The vapor deposition process itself may be of any suitable type, and may comprise chemical vapor deposition (CVD). For such purpose, the substrate may be disposed in a CVD chamber. The CVD chamber may be constructed and arranged in any suitable manner. In one embodiment, the CVD chamber includes an activation region having a first heat source. The vapor deposition process may be carried out in which at least one precursor of the germanium-containing film is activated by the first heat source. The process may further involve heating the substrate using a second heat source.

In the formation of germanium-rich GST films, doping can be carried out to improve compositional and performance properties of the film. Germanium can be doped in the GST film at levels of for example 5 to 10 atomic percent. In this manner, the 225 composition, containing 22.5% germanium, 22.5% antimony and 55% tellurium can be composition enhanced to contain from 27.5 to 32.5% germanium, with tellurium still being as high as 55%, or between 50 and 55%, with the remainder being antimony. Addition of germanium will increase crystallization temperature of the resulting alloy compared with that of the 225 composition, due to germanium doping imparting "friction" to atomic movement, and germanium's tetravalent coordinating bonding structure to tellurium being more stable than that of antimony bonding to tellurium.

As another modification of GST films, the ratio of GeTe to $Sb_2Te_3$ can be changed to alter crystallization temperature and other aspects of the materials properties of the film. GST is actually a pseudo-alloy, typically being a mix of the true alloy GeTe and $Sb_2Te_3$. The 225 composition GST film material is a mixture of two portions of GeTe and one portion of $Sb_2Te_3$. Germanium doping can be employed to increase germanium content above that of the 2:1 ratio of GeTe to $Sb_2Te_3$. The resulting alloy will reduce the tellurium content from 55% to a somewhat lower level around 50% or even slightly less, depending on the specific ratio of GeTe to $Sb_2Te_3$.

For example, a 3:1 ratio of GeTe to $Sb_2Te_3$ will be atomically $Ge_3Sb_2Te_6$, which as the atomic percentage of 27.2% germanium, 18.2% antimony and 54.5% tellurium, a 4:1 ratio of GeTe to $Sb_2Te_3$ will be atomically 30.7% germanium, 15.4% antimony, and 53.9% tellurium, a 5:1 ratio of GeTe to $Sb_2Te_3$ will be 33.3% germanium, 13.3% antimony and 53.3% tellurium, a 6:1 ratio of GeTe to $Sb_2Te_3$ will be 35.3% germanium, 11.8% antimony and 52.9% tellurium, and a 10:1 ratio of GeTe to $Sb_2Te_3$ will be 40% germanium, 8% antimony and 52% tellurium.

Doping the 225 composition of GST with germanium to make germanium-rich 225 will provide excess germanium in the matrix of the GeTe:$Sb_2Te_3$ mixture, beyond the ratio of m:n of such matrix alloys. Germanium-rich GST or germanium-doped 225 GST may have a ratio of GeTe:$Sb_2Te_3$ that is in a range of from 3:1 to 10:1. Specific illustrative compositions include a composition containing 27.2% germanium, 18.2% antimony and 54.5% tellurium as a first example, a composition containing 40% germanium, 8% antimony and 52% tellurium as a second example, a composition containing 30% germanium, 19% antimony and 51% tellurium as a third example, a composition containing 30% germanium, 16% antimony and 54% tellurium as a fourth example, and a composition containing 32% germanium, 14% antimony and 54% tellurium as a fifth example. More generally, germanium-rich GST or germanium self-doped 225 GST provides superior film properties, and includes GST alloys having from 27 to 33% germanium, from 14 to 23% antimony and from 50 to 55% tellurium.

Doping of GST films with dopants other than Ge, Sb or Te is contemplated by the present disclosure. Any suitable dopant species may be employed that improve the properties of the GST film for its intended purpose. For example, the GST films may be doped with carbon and/or nitrogen to improve film properties, e.g., to significantly reduce reset current of the film in a phase change memory applications. For such purpose, nitrogen doping at atomic percentages of from 4 to 10% and carbon doping at atomic percentages of from 2 to 6% can be employed.

In various applications, the present disclosure contemplates conformal GST thin films having an atomic composition comprising from 10 to 50% Sb, from 50 to 80% Te, from 10 to 50% Ge, from 0 to 20% N (e.g., from 3 to 20% N) and from 0 to 20% carbon (e.g., from 3 to 20% N), and wherein all atomic percentages of all components of the film total to 100 atomic %. Such films may be formed using CVD, e.g., in a low temperature CVD process as described herein.

Additional illustrative GST film compositions include compositions in which ratios of germanium (Ge) to antimony (Sb) to tellurium (Te) (atomic % (at. %)) may be about 2:2:5, about 4:1:5, about 30:15:55, or the like. In embodiments in which the ratio is 2:2:5, Ge is about 20-25 at. %, Sb is about 20-25 at. %, and Te is about 50-60 at. %. In embodiments in which the ratio is 4:1:5, Ge is about 40-45 at. %, Sb is about 5-10 at. %, and Te is about 50-55 at. %. In embodiments in which the ratio is 30:15:55, Ge is about 27-33 at. %, Sb is about 15-20 at. %, and Te is about 50-60 at. %. A further illustrative GST film composition contains from about 25 to 35% germanium, from about 15 225% antimony, and from about 45 to 55% tellurium. Another illustrative GST film composition contains from about 35 to 45% germanium, from about 1 to 10% antimony, and from about 45 to 55% tellurium. A still further illustrative film composition contains from about 75% to about 85% germanium, from about 5 to about 15% antimony, and from about 5 to about 15% tellurium. Another illustrative GST film composition contains from 27 to 33% germanium, from 45 to 55% tellurium, and the balance being antimony. In general, it is possible to add carbon up to 10 atomic percent, e.g., 3%, and to add nitrogen up to 15 atomic percent, e.g., 5%.

Figure 23:
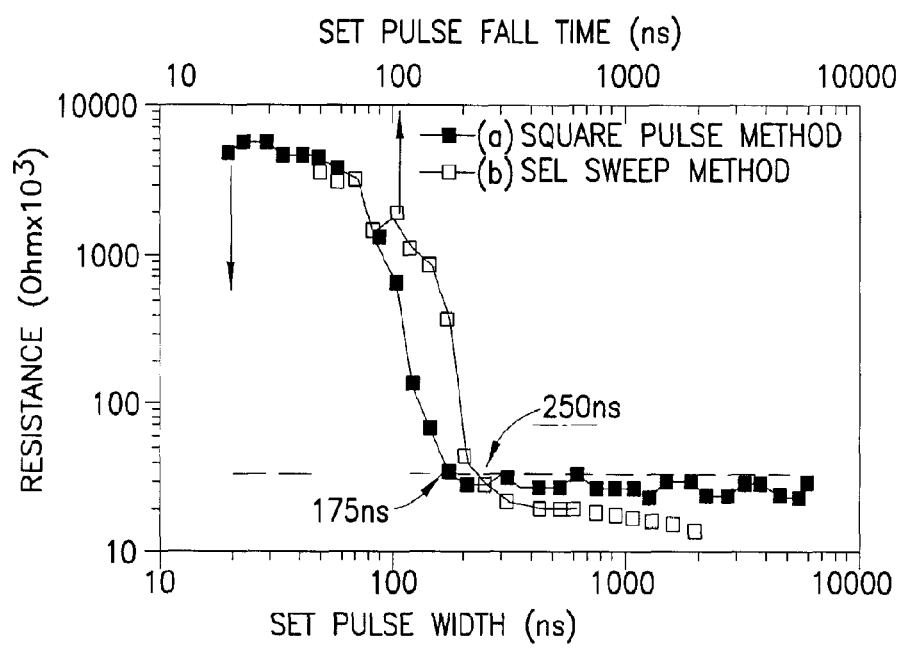
FIG. 23 is a graph of resistance as a function of set pulse width and set pulse fall time, for (a) set-speed using a square-shaped pulse method, and (b) set-speed using a set-sweep pulse method.

Low temperature processes of the present disclosure are usefully employed for MOCVD conformal deposition of GST in high aspect ratio trenches and holes. FIG. 23 is a photomicrograph of a void-free fill of GST in a via structure.

Figure 13:
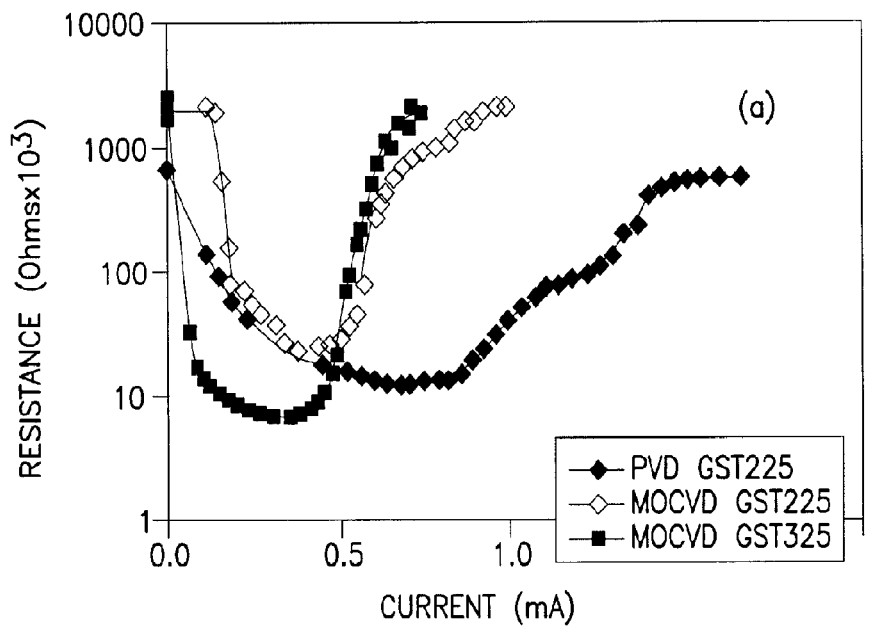
FIG. 13 is a graph of resistance, in ohms, as a function of reset current, in milliamps, showing data for a physical vapor deposition of 225 composition GST, and data for MOCVD of corresponding GST. The data show a low reset current to be achieved by conformal chemical vapor deposition in the low temperature process of the present disclosure.

FIG. 13 is a graph of resistance, in ohms, as a function of reset current, in milliamps, showing data for a physical vapor deposition of 225 composition GST, and data for MOCVD of corresponding GST. The data show a low reset current to be achieved by conformal chemical vapor deposition in the low temperature process of the present disclosure.

Figure 14:
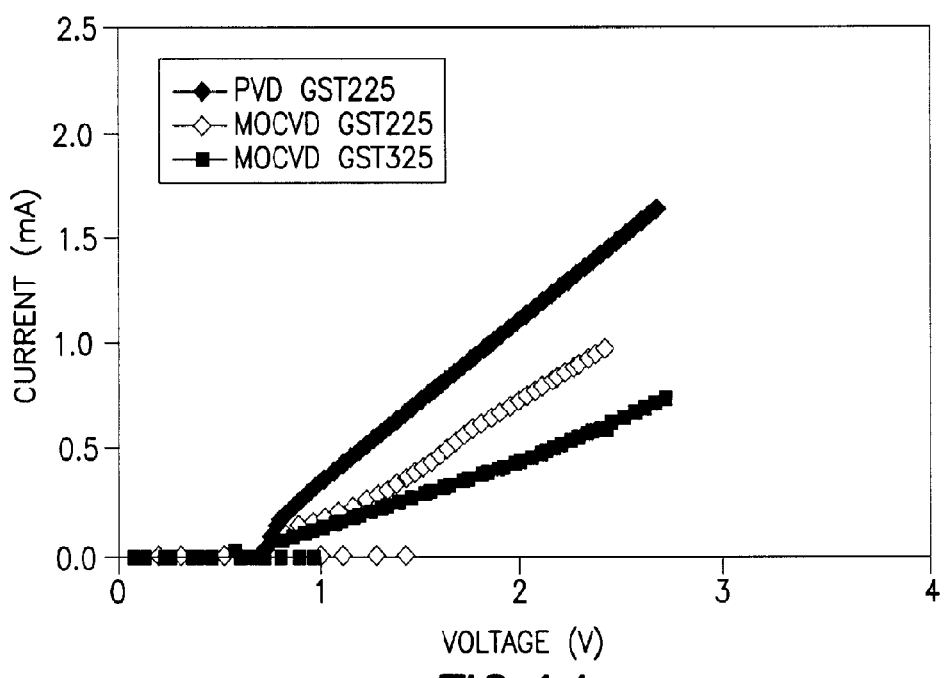
FIG. 14 is a graph of reset current, in milliamps, as a function of voltage, in volts, for a physical vapor deposition of 225 composition GST, and data for MOCVD of corresponding GST. The data, like that in FIG. 13, show a low reset current to be achieved by conformal chemical vapor deposition in the low temperature process of the present disclosure.

FIG. 14 is a graph of reset current, in milliamps, as a function of voltage, in volts, for a physical vapor deposition of 225 composition GST, and data for MOCVD of corresponding GST. The data, like that in FIG. 13, show a low reset current to be achieved by conformal chemical vapor deposition in the low temperature process of the present disclosure.

Figure 15:
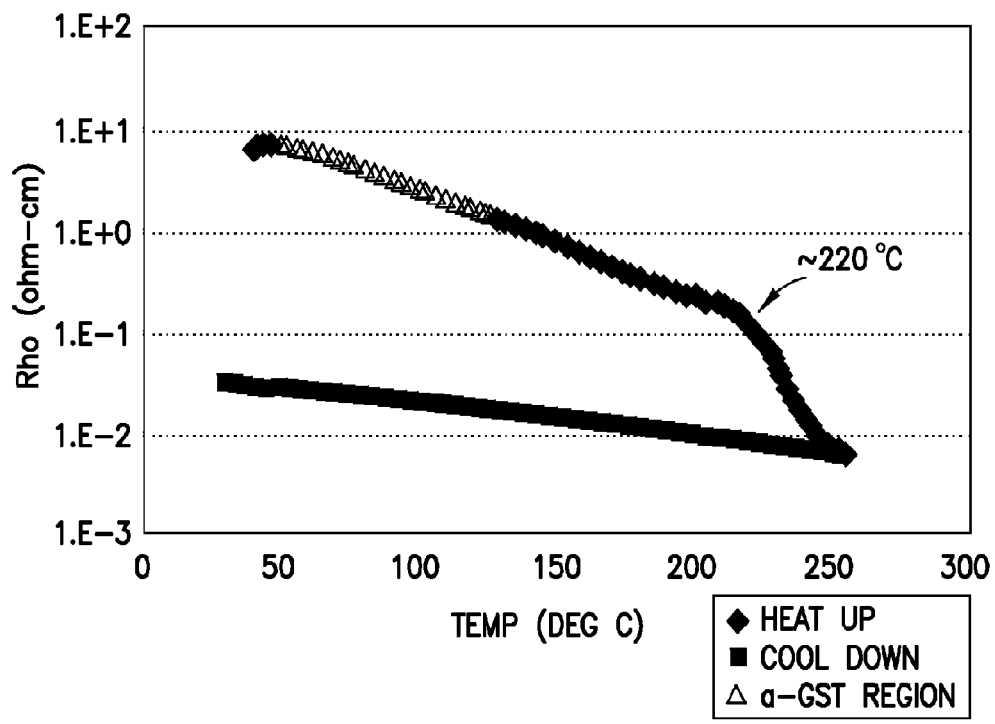
FIG. 15 is a graph of resistivity, as a function of temperature in degree C., for a GST film containing the following atomic percentages: 32% germanium, 13% antimony and 54% tellurium. The film had a thickness of 140 Å. Rho(RT) was approximately 6 ohm-centimeters to 0.03 ohm-centimeter. The film was not fully annealed (255° C.). The graph shows a crystallization temperature on the order of 220° C.

FIG. 15 is a graph of resistance, in amperes, as a function of temperature in degree C. for a GST film containing the following atomic percentages: 32% germanium, 13% antimony and 54% tellurium. The film had a thickness of 140 Å. Rho (RT) was approximately 6 ohm-centimeters to 0.03 ohm-centimeter. The film was not fully annealed (255° C.). The graph shows a crystallization temperature on the order of 220° C.

Figure 16:
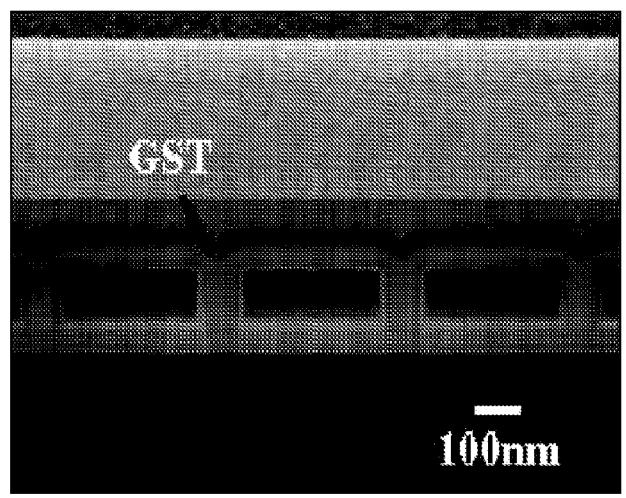
FIG. 16 is a graph of atomic concentrations of germanium, antimony, tellurium, and nitrogen, and Si intensity (arbitrary units), as a function of depth, in nanometers for an illustrative GST film having a nitrogen impurity at a concentration of less than 10 atomic percent.

FIG. 16 is a graph of atomic concentrations of germanium, antimony, tellurium, and nitrogen, and Si intensity (arbitrary units), as a function of depth, in nanometers for an illustrative GST film having a nitrogen impurity at a concentration of less than 10 atomic percent.

Figure 17A:
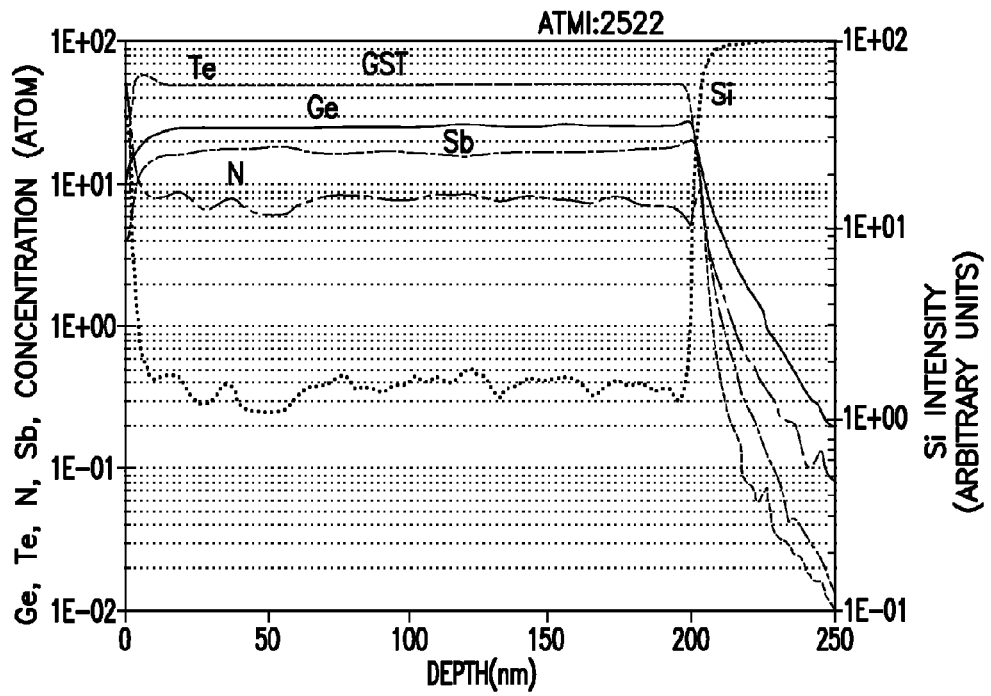
FIG. 17a is a graph of atomic concentration of oxygen and nitrogen, and Ge, Te, and Sb intensity (arbitary units), as a function of depth, in nanometers, for an illustrative GST film having essentially oxygen-free character and a carbon impurity on the order of approximately 3%.

FIG. 17a is a graph of atomic concentration of oxygen and nitrogen, and Ge, Te, and Sb intensity (arbitary units), as a function of depth, in nanometers, for an illustrative GST film having essentially oxygen-free character and a carbon impurity on the order of approximately 3%.

Figure 17B:
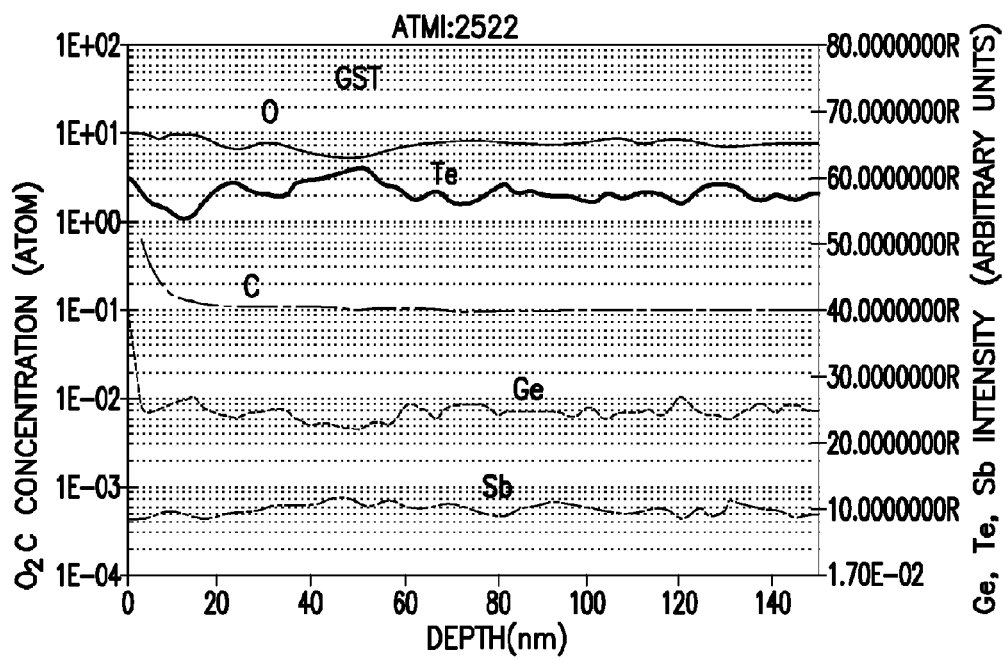
FIG. 17b is a graph of atomic concentration of oxygen and carbon, and Ge, Te, and Sb intensity (arbitary units), as a function of depth, in nanometers, for an illustrative GST film having essentially oxygen-free character and a carbon impurity on the order of approximately 10%.

FIG. 17b is a graph of atomic concentration of oxygen and carbon, and Ge, Te, and Sb intensity (arbitrary units), as a function of depth, in nanometers, for an illustrative GST film having essentially oxygen-free character and a carbon impurity on the order of approximately 10%.

Figure 18:
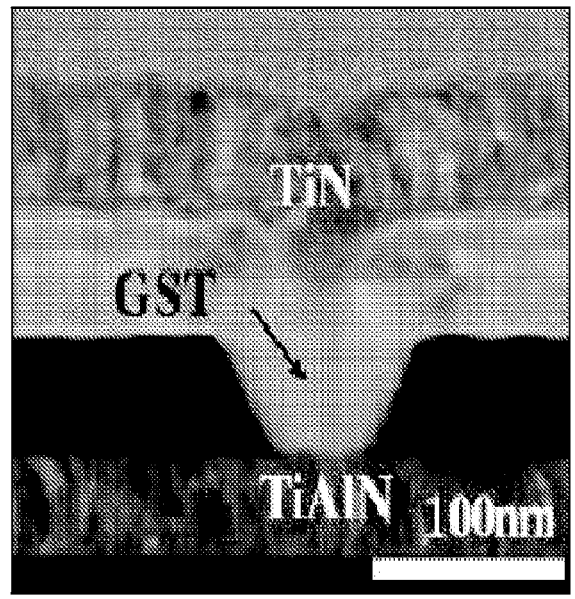
FIG. 18 is a photomicrograph showing GST material as deposited at low temperature in a low aspect ratio structure, in contact with a TiAlN bottom layer and a TiN top layer, after $7 \times 10^9$ phase change cycles.

FIG. 18 is a photomicrograph showing GST material as deposited at low temperature in a low aspect ratio structure, in contact with a TiAlN bottom layer and a TiN top layer, after $7 \times 10^9$ phase change cycles.

Figure 19:
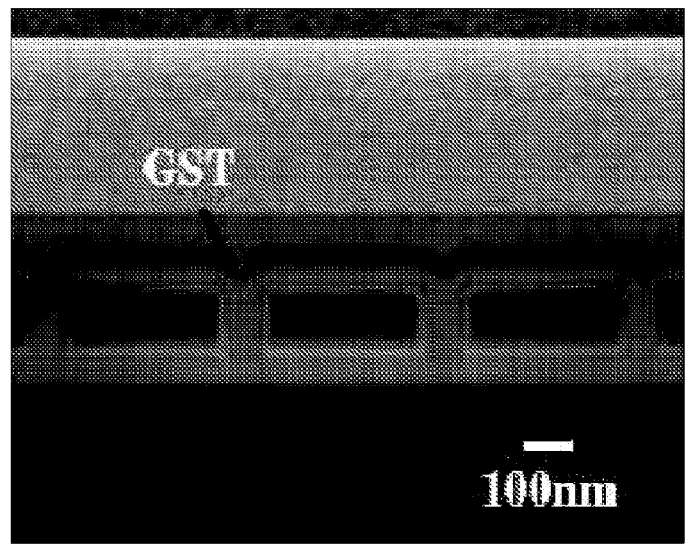
FIG. 19 is a photomicrograph of GST deposited in a high aspect ratio structure of a virgin device.
Figure 20:
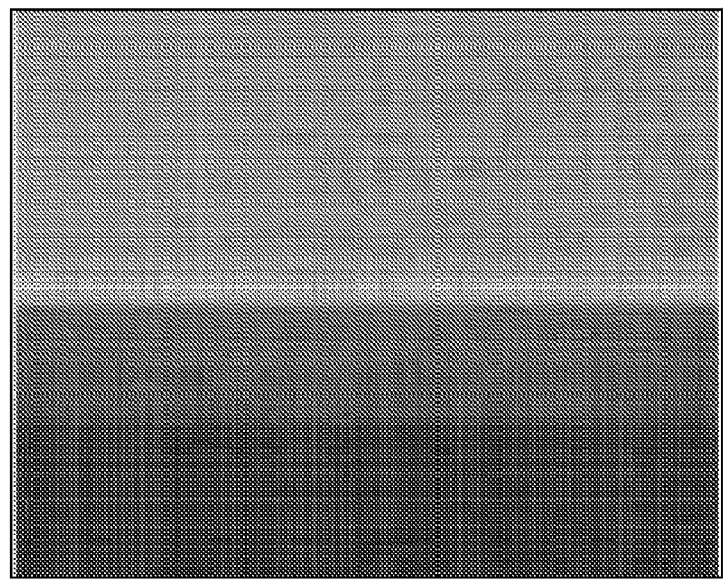
FIG. 20 is a photomicrograph of a PVD GST film after chemical mechanical planarization (CMP).

FIG. 19 is a photomicrograph of GST deposited in a high aspect ratio structure of a virgin device.

The deposition of GST films utilizing a low temperature chemical vapor deposition process as described in the present disclosure can be carried out to form a phase change memory device by steps including forming a bottom electrode for the device, followed by etching the bottom electrode/heater inside a via to form a recessed via. GST material then is deposited in the via, followed by chemical mechanical planarization, and cleaning of the device structure, following which a top electrode structure is formed.

Figure 10A:
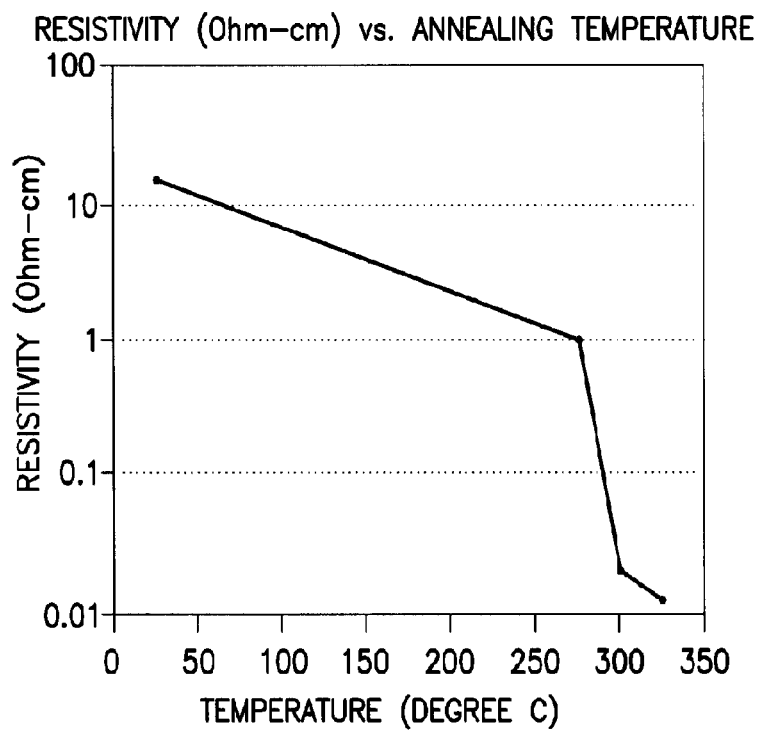
FIG. 10a is a graphical representation of the resistivity of GST film after annealing.
Figure 10B:
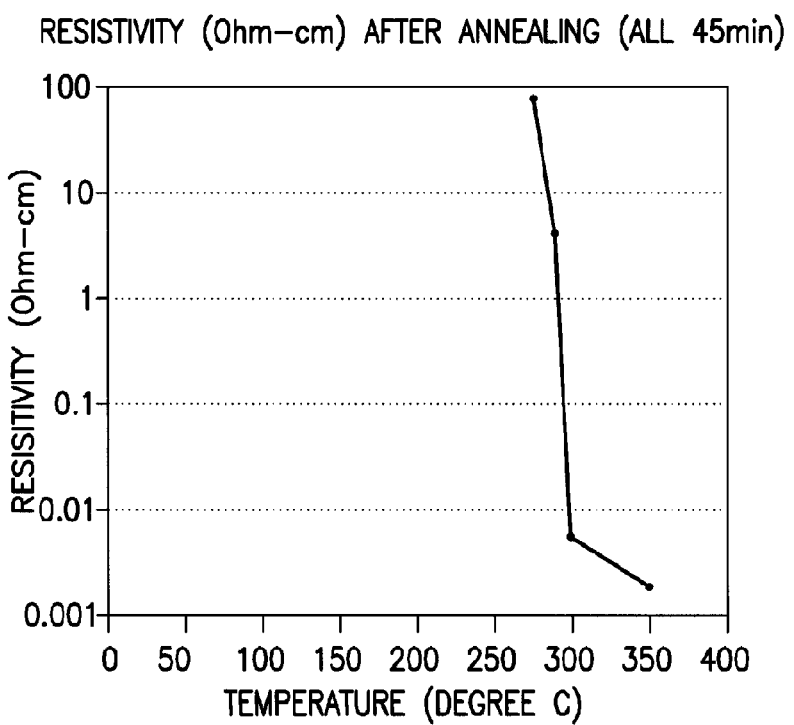
FIG. 10b is a graphical representation of the resistivity of GST film after annealing.

The processes and systems described herein have several advantages. First, deposition of the GST materials using heat (e.g., at about 200 degrees C. to 450 degrees C.) facilitates the reactivity of the Ge, Sb, and Te by increasing the reactivity thereof. Such an increase in reactivity means that GST can be deposited on a substrate at a lower temperature (e.g., at about 110 degrees C. to 250 degrees C.), yet achieving high percentages of Te. Second, the process can be a batch process in which any number of substrates can be processed in a similar configuration just by simply duplicating the process for additional substrates. Third, as can be seen in FIGS. 10a and 10b, processing of a substrate using the processes and systems described herein produce low resistivity films (high conductivity films) after annealing up to about 300 degrees C. FIG. 10a is a graph of resistivity, measured in ohm-cm, as a function of temperature, in ° C., for a GST film of 2:2:5 Ge:Sb:Te having a thickness of 444.1 Angstroms, with a film composition of 20.5% Ge, 23.5% Sb and 56.0% Te. FIG. 10b is a corresponding graph for a GST film having a composition of 4:0.5:5 Ge:Sb:Te, with a thickness of 308.1 Angstroms, and composed of 44.8% Ge, 5.3% Sb, and 49.8% Te. Also, as is shown in Table 4, the nitrogen content of a GST film is markedly reduced after annealing.

The features and advantages of the disclosure are more fully shown by the following example, which is intended to illustrative in character, and in no way limiting as regards the broad scope and applicability of the present disclosure.

EXAMPLE 1

In this example, electrical characterization was performed for devices including MOCVD deposited GST alloy with concurrent doping of nitrogen and carbon. In particular, a 2× reduction of the reset current was achieved by a doped MOCVD GST325 alloy composition. It was also demonstrated that devices with MOCVD GST325 show otherwise equivalent electrical performance to devices made using a physical vapor deposition (PVD) GST225 alloy. A cross-sectional scanning electron microscope (SEM) photo of the MOCVD GST based phase change memory (PCM) is shown in FIG. 18 hereof.

Alloy Materials and Device Structures

The composition of MOCVD GST deposited in the test devices was 30% Ge, 20% Sb, and 50% Te with an estimated composition range accuracy of +/−3%. During deposition, dopants of N and C were incorporated from precursors and co-reactants at atomic concentrations of 7% and 4% respectively as measured by SIMS (secondary ion mass spectrometry), with an estimated accuracy of +/−4% for N and +/−2% for C. The as-deposited film was amorphous, smooth, and conformal, so a high aspect ratio 3:1 device structure was able to be filled. Typical film density is equivalent between the as-grown film and annealed films. The doping in this MOCVD GST 325 also increased the crystallization temperature, Tx, to 220° C. compared to a typical Tx of 150° C. for GST 225. Although MOCVD GST325 conformal deposition was demonstrated to achieve void-free vertical high aspect ratio 3D test structures as shown in FIG. 21, device structures with shallow recessed pores were chosen so that direct comparison could be made to a PVD deposited GST225.

FIG. 18 shows the device structure containing a bottom TiAlN electrode as a heater, filled GST in the pore, and a Top TiN electrode. The shallow pore was formed by etching a hole with sloped side-walls in 500 Å PECVD SiO$_2$, etch stopped on TiAlN. The test structures had nominal design dimensions ranging from 70 nm to 200 nm. The TiAlN surface inside the pore was cleaned using a dilute HF (50:1) dip prior to MOCVD deposition of 750 Å GST. A 620 Å Ti/TiN layer was then deposited over the GST for the top electrode. The Ti/TiN and GST were patterned by lithography and a dry etch to isolate the GST and TiN top electrode in a single PCM device for testing. The test device in this discussion had a 100 nm nominal pore size based on FIB-SEM measurements.

Figure 21:
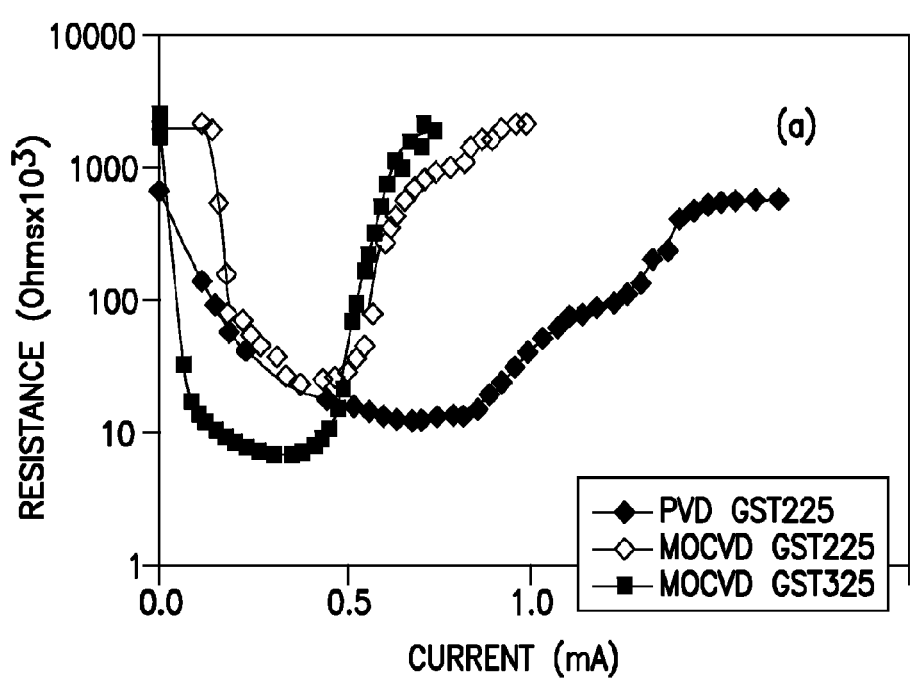
FIG. 21 shows the Reset Current (R-I) curves for PCM devices made from MOCVD GST 325, MOCVD GST 225, and PVD GST 225 with N and C.

FIG. 21 shows the Reset-Current (R-I) curves for PCM devices made from MOCVD GST325, MOCVD GST 225, and PVD GST225 without N and C. All the devices have a nominal size of 100 nm and measured sized of 103 nm for MOCVD GST325 and 106 nm for MOCVD GST225 and PVD GST225. In the device made with MOCVD GST325, the set resistance was below 10 kΩ and the reset resistance more than 1 MΩ, demonstrating more than 100× in dynamic range, as shown in FIG. 21. The reset current in the device using MOCVD GST325 was 0.6 mA, which was more than 2× smaller than the 1.4 mA reset current for a device made from PVD GST225. A reduction of reset current permitted more devices to be programmed in parallel, increasing the write bandwidth, a critical aspect for PCM in DRAM and SCM applications.

Figure 22:
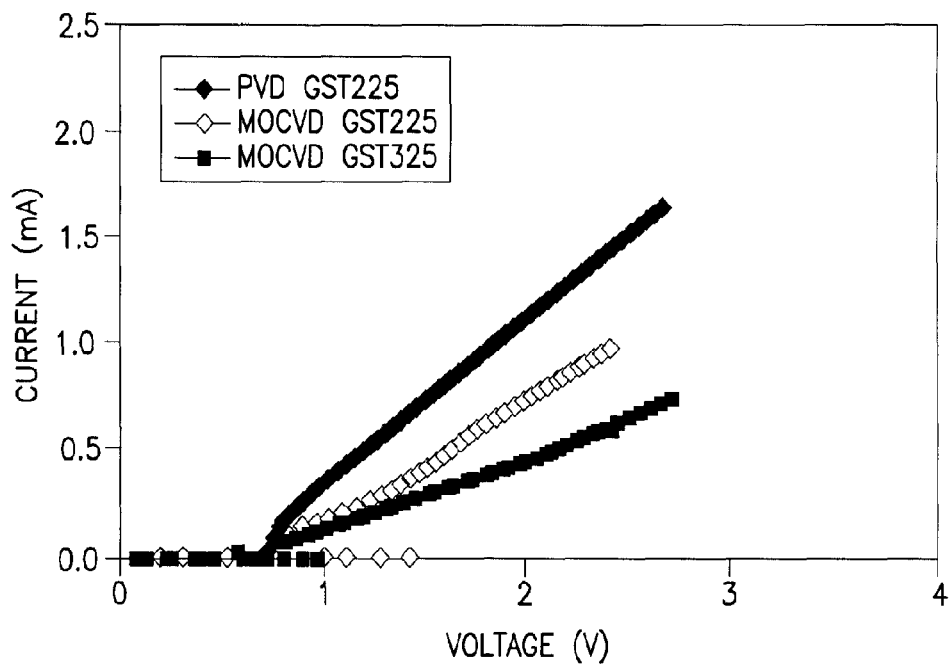
FIG. 22 is a graph of I-V curves in PCM devices, for PVD GST 225, MOCVD GST 225, and MOCVD GST 325.

FIG. 22 is a graph of I-V curves in PCM devices, for PVD GST 225, MOCVD GST 225, and MOCVD GST 325.

As illustrated in FIG. 22, both MOCVD samples with C and N doping had a larger dynamic on-resistance, resulting in more efficient ohmic heating during programming, which in turn contributed to the lower $I_{reset}$ seen in both MOCVD films. Nitrogen assisted in reducing the reset current in the PVD GST225 devices. It appears that such large reduction in reset current is not solely due to the 7+/−2% level of nitrogen doping alone, but rather to the combined effects of nitrogen and carbon-doping, their interaction with the bottom electrode, and the microstructure of the alloy. Although MOCVD GST225 achieved an equivalent low reset current level at similar N and C doping ranges, the set resistance for MOCVD GST325 was more than 2× lower than that of MOCVD GST225, making it an attractive alloy composition as an alternative to MOCVD GST225.

EXAMPLE 2

Set Speed

FIG. 23 shows set-speed measurements for a MOCVD GST325 device with a 100 nm pore diameter. Set-speed characterization measured by the square shaped pulse method is shown in curve (a), and curve (b) displays set-speed characterization by the set sweep pulse method. In both methods, the device was first reset with a reset current pulse at 120% of the saturation reset current level as indicated by the horizontal lines with open symbols. The reset pulse duration was always 100 ns. Amplitude of the square shaped set pulse was approximately half of the reset amplitude and varied in duration from 1 ins to 3 μs. The set sweep pulse had a maximum amplitude of 120% reset level, with a rise of 100 ns, a width of 200 ns and a varying fall times ranging from 50 ns to 2 μs. The set speed was determined by the time required for the resistance level to fall below the demarcation level which is $\frac{1}{6}^{th}$ logarithmically up from full set between the full reset and full set levels. Using the square pulse method, we measured a set speed of 175 ns, very comparable to a PVD GST225 device with the same structure. We measured a 260 ns set speed using the set sweep method to reach the set demarcation value, also very comparable to the PVD GST225 alloy. At the identical device dimension and structure, set-speed is governed by alloy composition, impurities, and material morphology such as grain size. The results indicated that the MOCVD GST325 alloy with its unique composition combined with doping of 7+/−2% nitrogen and 4+/−2% carbon has similar set-speed performance to PVD GST225 devices.

EXAMPLE 3

10 Year Data Retention Temperature

Figure 24:
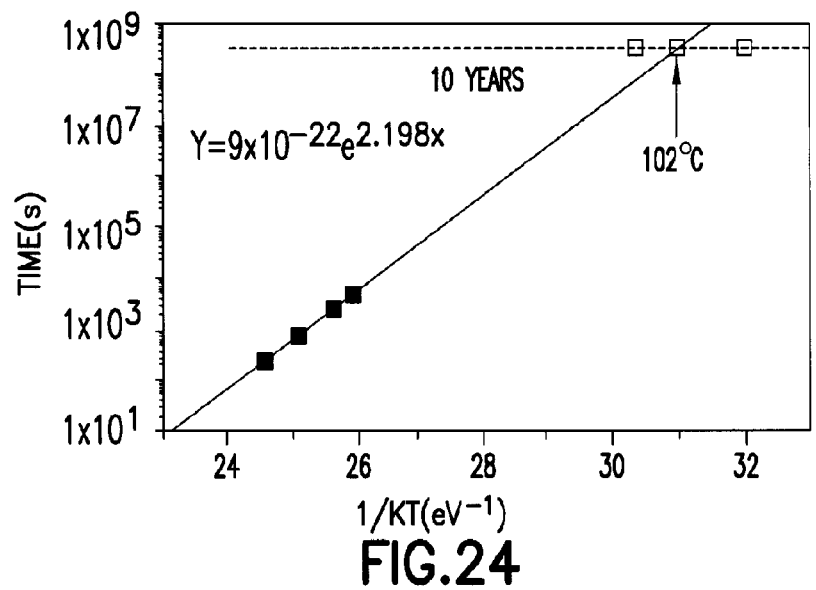
FIG. 24 is a graph of time versus 1/KT, showing the 10 year data retention temperature established using the time to fail method.

With N and C impurities it is very important to understand the reliability aspects of the corresponding devices. FIG. 24 shows the 10 year data retention temperature established using the time to fail method. The time to fail is measured after a resistance value of a fully reset device reaches a 67 k$\Omega$ demarcation level at elevated temperatures of 180, 185, 190, and 200° C. FIG. 24 shows the fail-time data extrapolated to 10 years on an Arrhenius plot, giving a temperature of 102° C. with an estimated error margin of +/−10° C. The estimated activation energy was calculated as 2.2 eV Similarly, the 10 year data retention temperature of a PVD GST225 device was measured to be 105° C. Thus, the CVD GST325 alloy with N and C doping had a similar 10 year data retention temperature to that of a PVD GST225 device.

EXAMPLE 4

Cycle Endurance

Figure 25:
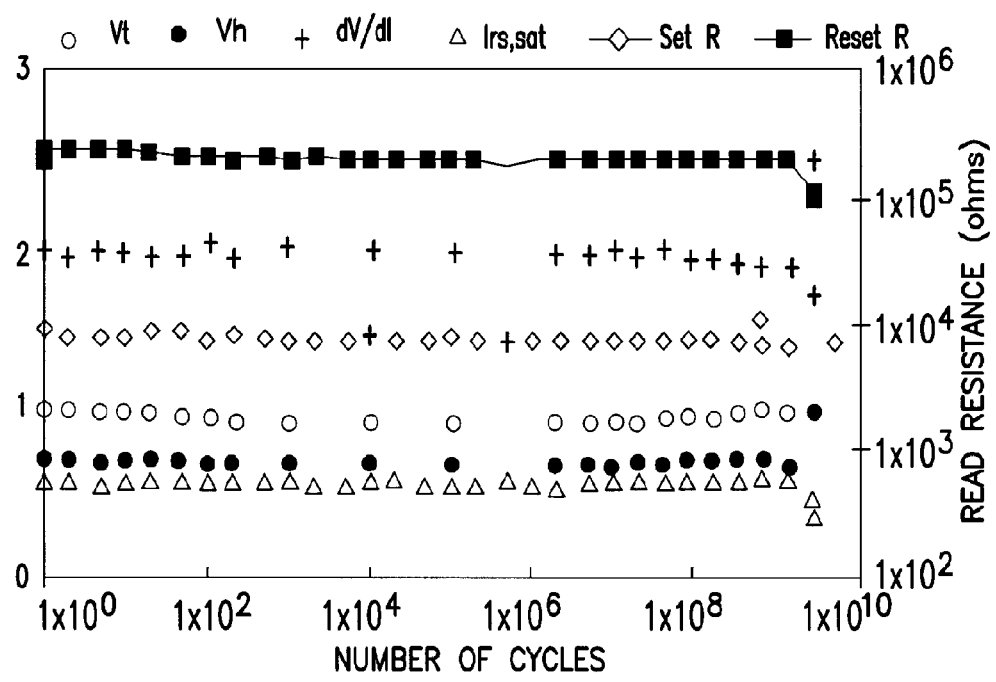
FIG. 25 is a graph of cycle endurance test data for a PCM device made of MOCVD GST325, using a square pulse method with a reset pulse time of 100 ns and set pulse time of 500 ns with a cycle period of 1 μsec.

FIG. 25 shows the cycle endurance test for a PCM device made of MOCVD GST325. The test used the square pulse method with a reset pulse time of 100 ns and set pulse time of 500 ns with a cycle period of 1 μsec. $1.3 \times 10^9$ cycles were completed with a stable Rreset, Rset, Vt, Vh, and dV/dI before the device degraded, resulting in a reduced dynamic range. The device shown in FIG. 18 endured more than $7 \times 10^9$ cycles without failure or void formation under similar test conditions in this non-confined low aspect ratio structure. One of the keys for the high cycle endurance was the deposit of void-free and high density amorphous film, which maintained a small density change in the crystalline phase after annealing without void formation. With 3:1 high aspect ratio structure devices, more than $1 \times 10^{10}$ cycle endurance has been achieved with a $R_{reset}/R_{set}$ dynamic range of 100× from devices made of MOCVD GST, comparable to the best reported cycle endurance of $1 \times 10^{10}$ in a very narrow 7.5 nm high aspect ratio confined cell structure device made of MOCVD GST.

Further, the possible improvement in cycle endurance if the device were in a high aspect ratio, fully confined structure and CMP were used to remove excess GST material above the pore, followed by sealing of the cell with a top electrode to effect PCM confined cell integration. The $1.3 \times 10^9$ cycle endurance data that was recorded represented an indication of the device stability and demonstrated the capability of this MOCVD GST325 alloy to enable the continued scaling of PCM with increased cycle endurance.

The foregoing demonstrated that a 100 nm size PCM device made with MOCVD GST325 had (1) a set speed of 175-260 ns, (2) a reset current of ~0.6 mA, (3) a 10 year data retention temperature of 102° C., and (4) a cycle endurance of $7 \times 10^9$. The device speed and data retention were comparable to that of devices made with PVD GST225 using the same test structure. MOCVD GST325 however, showed a 2× reduction of reset current as well as improved set resistance relative to that of the PVD GST225 alloy.

While the disclosure has been primarily directed to chemical vapor deposition as the deposition methodology for deposit of GST materials and films, it is to be appreciated that the invention is amenable to utilization of other vapor deposition techniques. For example, atomic layer deposition may be usefully employed within the broad scope of the present disclosure, to effect deposition of GST materials and films. For this purpose, the ALD vapor deposition process that is used to deposit the GST material can be carried out in any suitable manner to produce product GST films, within the skill of the art, based on the disclosure herein. For example, ALD process parameters, e.g., pulse times, cycle durations, temperatures, pressures, volumetric flow rates, etc. can be determined by simple successive empirical runs in which process parameters are selectively varied to determine the best multivariable process envelope for conducting the ALD vapor deposition process.

In addition, it will be appreciated that the chemical species employed to deposit the chalcogenide material may be thermally activated or in other manner energized to generate transitory species for the deposition. By this approach, a chemical species may be transformed into a different chemical form to provide deposition species that may for example be short-lived but are sufficiently present to enable deposition, in the transport from the activation region to the wafer surface. In this manner, a deposition chemical species may be generated in situ for the deposition operation.

With respect to the carbon and nitrogen species that are incorporated in the GST film in various embodiments of the disclosure, it will be recognized that these species may be provided in a bound or non-bound form. For example, the nitrogen as mentioned may be introduced in free form as nitrogen gas, or alternatively as a nitrogen-containing moiety in a precursor or coreactant that is introduced to the deposition operation.

Further, lower deposition temperatures are beneficial from the perspective of maintaining the amorphous character of the deposited chalcogenide film, and enabling higher levels of carbon to be incorporated in the growing film, thereby providing beneficial nucleation sites favoring more rapid growth of the chalcogenide film, in addition to reducing capital and operating costs associated with the deposition system. In this respect, the nucleation sites present in the film may derive from the presence of carbon as well as nitrogen, and may also be generated as a result of carbon-nitrogen interaction. In general, the more nucleation sites present in the chalcogenide film, the faster nucleation will take place and the more rapid will be the transformation between amorphous and crystalline states in the operation of the GST material. Broadly, the greater the population of nucleation sites, the shorter are the required crystalline lengths involved in the propagation of crystalline transformation, and the quicker the GST device will be in response to a phase change stimulus.

INDUSTRIAL APPLICABILITY

The germanium-antimony-tellurium (GST) alloy films of the disclosure are usefully employed in phase change memory devices, including NOR flash memory, dynamic random access memory (DRAM) and storage class memory (SCM), taking advantage of the properties of such chalcogenide alloy, which can be readily switched between crystalline (binary 1) and amorphous (binary 0) states, or in some applications, between amorphous, crystalline and two additional partially crystalline states.

What is claimed is:

1. A chalcogenide germanium-antimony-tellurium material doped with carbon and nitrogen, wherein the amount of tellurium is greater than 50 at. %, wherein carbon is doped in said material at 2-20 at. %, and wherein nitrogen is doped in said material at 2-20 at. %.

2. A material according to claim 1, wherein the amount of tellurium is at least an amount selected from the group consisting of:
  55 at. % tellurium;
  54.5% tellurium;
  53.9% tellurium;
  53.3% tellurium;
  52.9% tellurium;
  52% tellurium;
  51% tellurium; and
  54% tellurium.

3. The material of claim 1, wherein the amount of tellurium is in a range of from 55 to 80 at. %.

4. The material of claim 1, wherein carbon is doped in said film at 3 to 20 at. %.

5. The material of claim 1, wherein carbon is doped in said film at 2 to 15 at. %.

6. The material of claim 1, wherein carbon is doped in said film at 2 to 10 at. %.

7. The material of claim 1, wherein carbon is doped in said film at 3 to 10 at. %.

8. The material of claim 1, wherein carbon is doped in said film at 2 to 6 at. %.

9. The material of claim 1, wherein the material comprises a vapor deposited film wherein tellurium derives from a ditelluride precursor of the formula R—Te—Te—R in which each R is independently selected from methyl, ethyl, isopropyl, tertiary butyl, and trimethylsilyl at. %.

10. The material of claim 1, wherein nitrogen is doped in said film at 3 to 20 at. %.

11. The material of claim 1, wherein nitrogen is doped in said film at 3 to 15 at. %.

12. The material of claim 1, wherein nitrogen is doped in said film at 3 to 12 at. %.

13. The material of claim 1, wherein nitrogen is doped in said film at 3 to 10 at. %.

14. The material of claim 1, wherein nitrogen is doped in said film at 5 to 10 at. %.

15. The material of claim 1, as conformally coated on a substrate.

16. The material of claim 15, wherein the substrate comprises a microelectronic device or device precursor structure substrate.

17. A microelectronic device including a material of claim 1.

18. The microelectronic device of claim 17, comprising a phase change memory cell.

19. The microelectronic device of claim 17, comprising a memory device.

20. A GST film having an atomic composition comprising from 0 to 50% Sb, from 55 to 80% Te, from 20 to 50% Ge, from 3 to 20% N and from 2 to 15% carbon, and wherein all atomic percentages of all components of the film total to 100 atomic %.

21. A GST thin film having an atomic composition comprising from 10 to 50% Sb, from 55 to 80% Te, from 10 to 50% Ge, from 3 to 20% N and from 3 to 20% carbon, and wherein all atomic percentages of all components of the film total to 100 atomic %.

* * * * *

UNITED STATES PATENT AND TRADEMARK OFFICE
CERTIFICATE OF CORRECTION

PATENT NO. : 9,012,876 B2
APPLICATION NO. : 13/637018
DATED : April 21, 2015
INVENTOR(S) : Zheng Page 1 of 1

It is certified that error appears in the above-identified patent and that said Letters Patent is hereby corrected as shown below:

In the Specification

Column 18, line 59: delete "1 ins" insert -- 11 ns --.

Signed and Sealed this
Thirtieth Day of June, 2015

Michelle K. Lee
*Director of the United States Patent and Trademark Office*